(12) United States Patent
Kim et al.

(10) Patent No.: US 12,082,433 B2
(45) Date of Patent: Sep. 3, 2024

(54) DISPLAY DEVICE

(71) Applicant: SAMSUNG DISPLAY CO., LTD., Yongin-si (KR)

(72) Inventors: Hyeongpil Kim, Osan-si (KR); Byoung-Hun Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 17/489,775

(22) Filed: Sep. 30, 2021

(65) Prior Publication Data
US 2022/0165974 A1 May 26, 2022

(30) Foreign Application Priority Data
Nov. 25, 2020 (KR) .................. 10-2020-0160018

(51) Int. Cl.
*H10K 50/13* (2023.01)
*H10K 50/165* (2023.01)
*H10K 59/122* (2023.01)
*H10K 59/38* (2023.01)

(52) U.S. Cl.
CPC ......... *H10K 50/131* (2023.02); *H10K 50/165* (2023.02); *H10K 59/122* (2023.02); *H10K 59/38* (2023.02)

(58) Field of Classification Search
CPC .. H10K 50/131; H10K 50/165; H10K 59/122; H10K 59/38; H10K 59/353; H10K 50/16; H10K 59/123; G02B 5/201
See application file for complete search history.

(56) References Cited

U.S. PATENT DOCUMENTS

| | | | |
|---|---|---|---|
| 7,821,201 B2 | 10/2010 | Hatwar et al. | |
| 8,283,054 B2 | 10/2012 | Spindler et al. | |
| 10,325,961 B2 | 6/2019 | Wu et al. | |
| 2014/0045298 A1* | 2/2014 | Meng | H10K 50/166 438/99 |
| 2015/0014651 A1* | 1/2015 | Choi | H10K 85/654 257/40 |
| 2016/0204371 A1* | 7/2016 | Kim | H10K 50/16 257/40 |

(Continued)

FOREIGN PATENT DOCUMENTS

KR 10-2020-0014045 2/2020

*Primary Examiner* — S M Sohel Imtiaz
(74) *Attorney, Agent, or Firm* — Lewis Roca Rothgerber Christie LLP

(57) ABSTRACT

A display device includes an upper display substrate including a first pixel region for emitting a first light, a second pixel region for emitting a second light different from the first light, and a third pixel region for emitting a third light different from the first light and the second light; and a lower display substrate including a first light-emitting element overlapping the first pixel region, a second light-emitting element overlapping the second pixel region, and a third light-emitting element overlapping the third pixel region. The second light-emitting element includes one or more first stacks for emitting the second light, the third light-emitting element includes one or more second stacks for emitting the third light, and a concentration of a conductive material included in the one or more first stacks is higher than a concentration of a conductive material included in the one or more second stacks.

20 Claims, 6 Drawing Sheets

(56) References Cited

U.S. PATENT DOCUMENTS

| | | | |
|---|---|---|---|
| 2016/0218154 A1* | 7/2016 | Pyo | H10K 59/35 |
| 2017/0054101 A1* | 2/2017 | Pyo | H10K 50/125 |
| 2017/0309859 A1* | 10/2017 | Lee | H10K 50/131 |
| 2018/0138436 A1* | 5/2018 | Takagi | H10K 50/12 |
| 2018/0158884 A1* | 6/2018 | Lee | H10K 50/166 |
| 2018/0190928 A1* | 7/2018 | Wang | H10K 50/155 |
| 2019/0288239 A1* | 9/2019 | Ichikawa | H10K 59/38 |
| 2020/0044178 A1 | 2/2020 | Lim et al. | |
| 2021/0005669 A1* | 1/2021 | Kamada | H10K 59/65 |

* cited by examiner

DISPLAY DEVICE

CROSS-REFERENCE TO RELATED APPLICATIONS

This application claims priority from and the benefit of Korean Patent Application No. 10-2020-0160018, filed on Nov. 25, 2020, which is hereby incorporated by reference for all purposes as if fully set forth herein.

BACKGROUND

Field

Embodiments relate generally to a display device and more particularly, to a display device including light-emitting elements with different structures.

Discussion of the Background

Various display devices used in a multimedia device, for example, a television, a cellular phone, a tablet computer, a navigation, and a game console have been developed. These display devices include a light-emitting element (e.g., a self-luminescent display element) which emits light by using a light-emitting material to display images.

Specifically, the light-emitting element recombines holes and electrons injected from a first electrode and a second electrode in an emission layer thereof to generate excitons, and drops the generated excitons to the ground state to emit light.

For application of a light-emitting element to a display device, it is required to improve the luminous efficiency and lifespan of the light-emitting element, and it is continuously required to develop the light-emitting element stably satisfying the requirements.

The above information disclosed in this Background section is only for understanding of the background of the inventive concepts, and, therefore, it may contain information that does not constitute prior art.

SUMMARY

Display devices constructed according to the principles of the invention are capable of increasing and improving lifespan and luminous efficiency of the display devices by providing a display panel including a light-emitting element with improved efficiency and lifespan.

Additional features of the inventive concepts will be set forth in the description which follows, and in part will be apparent from the description, or may be learned by practice of the inventive concepts.

According to an aspect of the invention, a display device includes: an upper display substrate including a first pixel region configured to emit a first light having a first wavelength region, a second pixel region configured to emit a second light having a second wavelength region different from the first wavelength region of the first light, and a third pixel region configured to emit a third light having a third wavelength region different from the first wavelength region of the first light and the second wavelength region of the second light; and a lower display substrate including a first light-emitting element disposed to overlap the first pixel region, a second light-emitting element disposed to overlap the second pixel region, and a third light-emitting element disposed to overlap the third pixel region, and the second light-emitting element includes one or more first stacks configured to emit the second light, the one or more first stacks including a plurality of organic layers, and the third light-emitting element includes one or more second stacks configured to emit the third light, the one or more second stacks including a plurality of organic layers, and the one or more first stacks include a first hole transport region, a first emission layer, and a first electron transport region, and the one or more second stacks include a second hole transport region, a second emission layer, and a second electron transport region, and a concentration of a conductive material included in the first electron transport region is higher than a concentration of a conductive material included in the second electron transport region.

The first electron transport region may include a first electron transport layer, the second electron transport region may include a second electron transport layer, and a concentration of a conductive material included in the first electron transport layer may be higher than a concentration of a conductive material included in the second electron transport layer.

The conductive material may be a p-type dopant.

The conductive material may include at least one of 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP-9), dipyrazino[2,3-f: 2',3'-h] quinoxaline-2,3,6,7,10,11-hexacarbonitrile (HAT-CN), 2,3,5,6-tetrafluoro-7,7,8,8-tetracyanoquinodimethane (F4-TCNQ), or tetracyanoquinodimethane (TCNQ).

The first electron transport region may include a first electron transport layer, the second electron transport region may include a second electron transport layer, and a concentration of an insulating material included in the first electron transport layer may be lower than a concentration of an insulating material included in the second electron transport layer.

The insulating material may include at least one halogenated metal or may include an oxide having a dielectric constant of about 5 or more.

The lower display substrate may further include a bank disposed between the second light-emitting element and the third light-emitting element, and the bank may not be disposed between the first light-emitting element and the second light-emitting element.

The upper display substrate may further include a non-pixel region adjacent to the first, second, and third pixel regions, and the lower display substrate may further include a pixel-defining film disposed to overlap the non-pixel region, and the bank may be disposed to overlap the pixel-defining film.

The upper display substrate may include: a first light control portion that overlaps the first pixel region and includes a first quantum dot; a second light control portion that overlaps the second pixel region and transmits the second light; and a third light control portion that overlaps the third pixel region and transmits the third light, and the first quantum dot may be configured to convert the second light or the third light into the first light.

The second light-emitting element may include the one or more first stacks and the one or more second stacks, and the second light control portion may include a second quantum dot, and the second quantum dot may be configured to convert the third light into the second light.

The second light-emitting element may include only the one or more first stacks.

The first light-emitting element may have a same structure as the second light-emitting element.

The third light-emitting element may include only the one or more second stacks.

The first light may be a red light, the second light may be a green light, and the third light may be a blue light.

The one or more first stacks may be configured to emit green phosphorescence, and the one or more second stacks may be configured to emit blue fluorescence.

The second light-emitting element may include a first electron transport layer, and the third light-emitting element may include a second electron transport layer, and a concentration of an electron transport material included in the second electron transport layer may be equal to or greater than a concentration of an electron transport material included in the first electron transport layer.

According to another aspect of the invention, a display device includes a base layer in which a first pixel region, a second pixel region, and a third pixel region are defined; and a first light-emitting element disposed on the base layer to overlap the first pixel region, a second light-emitting element disposed on the base layer to overlap the second pixel region, and a third light-emitting element disposed on the base layer to overlap the third pixel region, and the second light-emitting element includes one or more first stacks configured to emit a first color light, the third light-emitting element includes one or more second stacks configured to emit a second color light, and the first stack includes a first hole transport layer, a first emission layer configured to emit the first color light, and a first electron transport layer, and the second stack includes a second hole transport layer, a second emission layer configured to emit the second color light, and a second electron transport layer, and electron transport properties of the first electron transport layer are greater than electron transport properties of the second electron transport layer.

The first color light is a green light, the second color light is a blue light, and a concentration of a conductive material included in the first electron transport layer may be higher than a concentration of a conductive material included in the second electron transport layer, and the conductive material may include at least one of NDP-9, HAT-CN, F4-TCNQ, or TCNQ.

A concentration of an insulating material included in the first electron transport layer may be lower than a concentration of an insulating material included in the second electron transport layer, and the insulating material may include at least one halogenated metal or may include an oxide having a dielectric constant of about 5 or more.

The display device may further include a bank disposed on the base layer, the bank disposed between the second light-emitting element and the third light-emitting element, and the bank may not be disposed between the first light-emitting element and the second light-emitting element.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
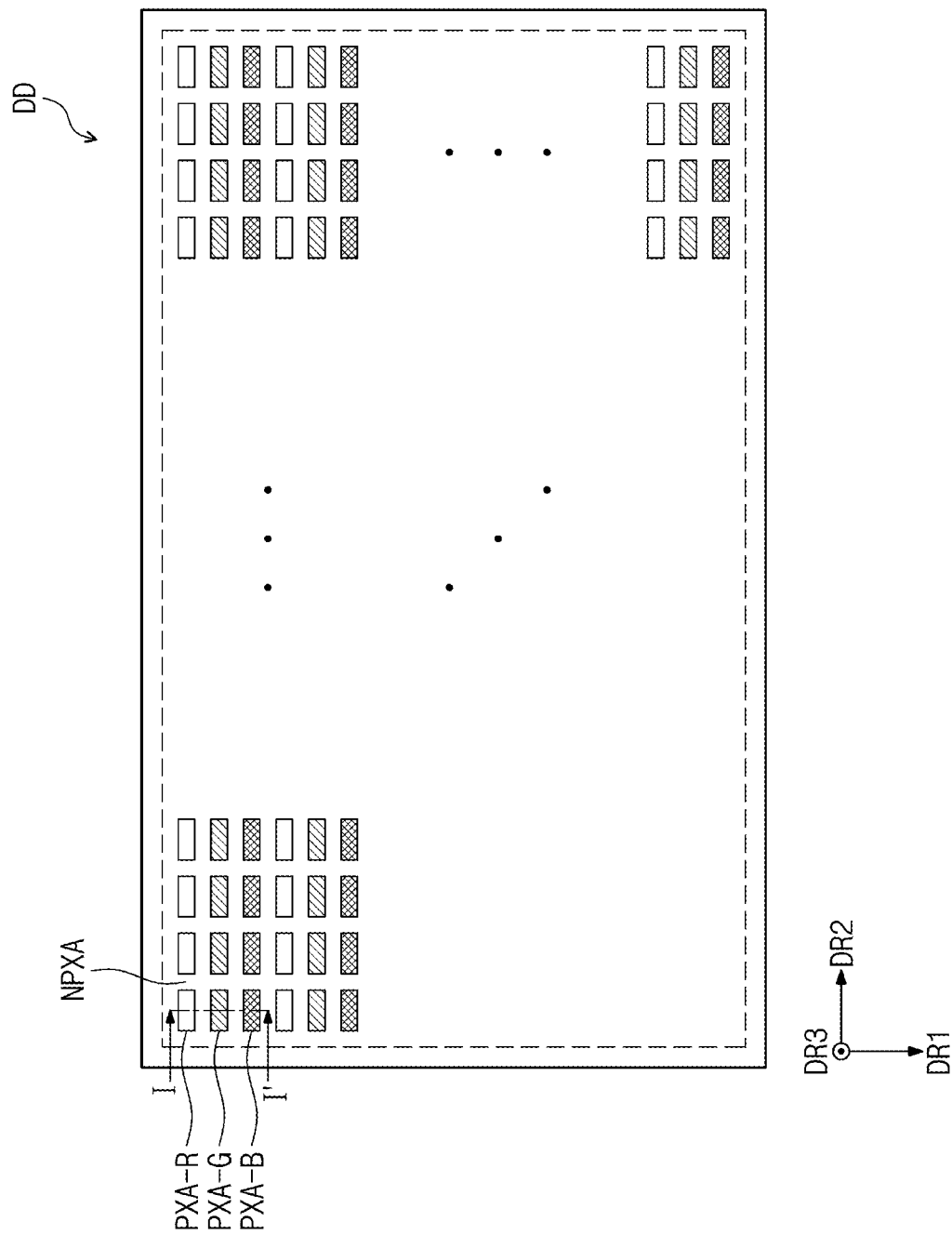
FIG. 1 shows a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display module according to an embodiment will be explained in detail with reference to the accompanying drawings.

Figure 2A:
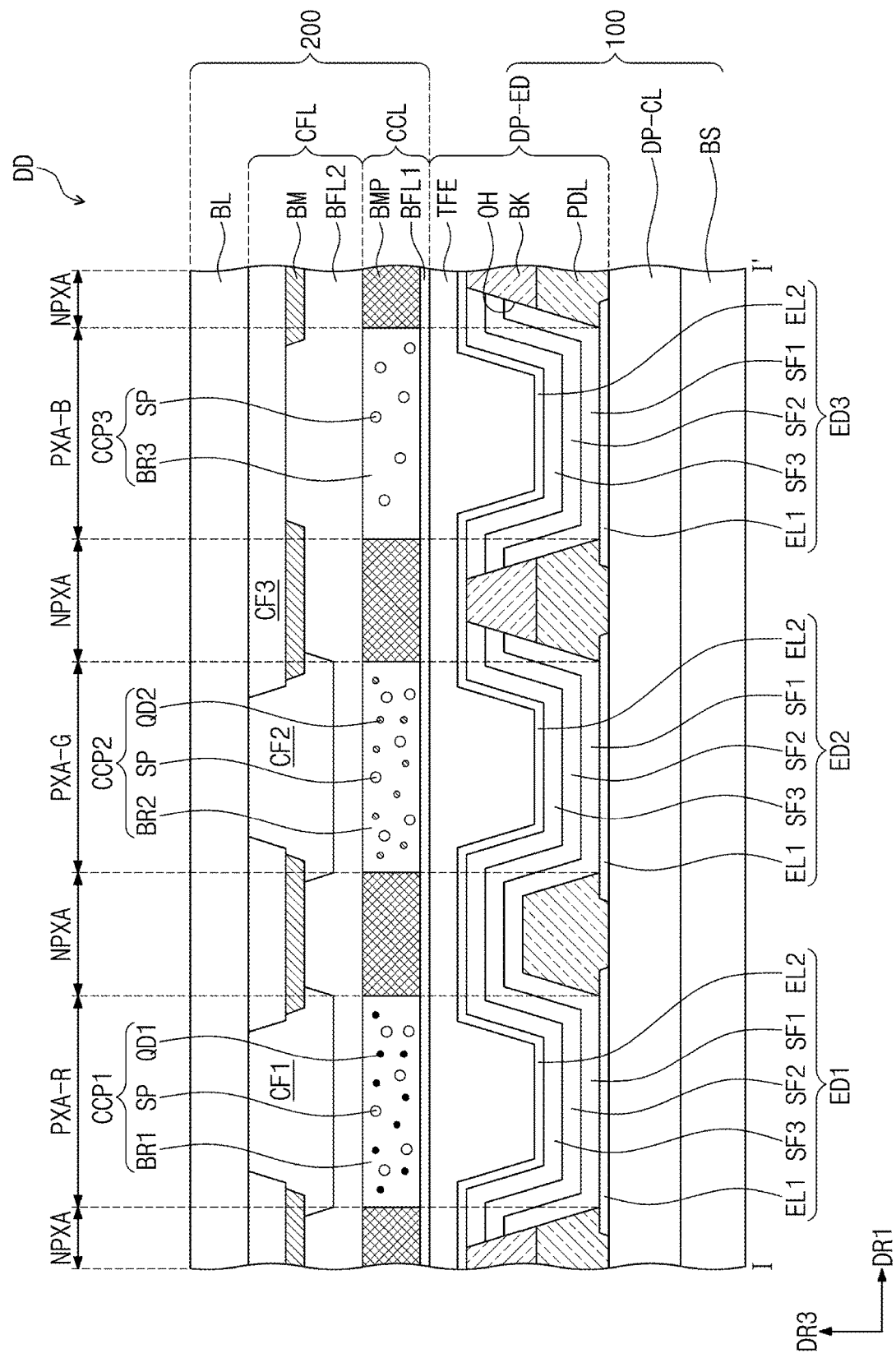
FIG. 2A shows a cross-sectional view taken along line I-I' in FIG. 1 illustrating an embodiment of light-emitting elements of the display device of FIG. 1.

FIG. 1 is a plan view illustrating an embodiment of a display device DD. FIG. 2A is a cross-sectional view of a display device DD according to an embodiment. FIG. 2A is a cross-sectional view illustrating a portion taken along line I-I' in FIG. 1.

Referring to FIG. 1, a non-pixel region NPXA and pixel regions PXA-R, PXA-G, and PXA-B may be defined in a display device DD. The non-pixel region NPXA may be a region that does not emit light, and the pixel regions PXA-R, PXA-G, and PXA-B may be regions that emit light generated within the display device DD. Each of the pixel regions PXA-R, PXA-G, and PXA-B may be spaced apart from each other in a plan view.

Referring to FIG. 2A, the display device DD may include a lower display substrate 100 and an upper display substrate 200 disposed on the lower display substrate 100. For example, a filling layer may be filled between the lower display substrate 100 and the upper display substrate 200. Hereinafter, the lower display substrate 100 will be described as a display panel 100.

The display panel 100 may be at least one of a liquid crystal display panel, an electrophoretic display panel, a microelectromechanical system (MEMS) display panel, an electrowetting display panel, an organic light emitting display panel, a micro LED display panel, a quantum dot display panel, or a quantum rod display panel, but embodiments are not limited thereto.

The display panel 100 may include a base layer BS, a circuit layer DP-CL provided on the base layer BS, and a display element layer DP-ED. The display element layer DP-ED may include a pixel-defining film PDL and light-emitting elements ED1, ED2, and ED3 disposed to overlap openings OH defined in the pixel-defining film PDL.

The pixel-defining film PDL may separate pixel regions PXA-R, PXA-G, and PXA-B. The non-pixel regions NPXA may be regions interposed between the neighboring pixel regions PXA-R, PXA-G, and PXA-B, and may be regions corresponding to the pixel-defining film PDL.

The light-emitting elements ED1, ED2, and ED3 are disposed to overlap the pixel regions PXA-R, PXA-G, and PXA-B. The pixel regions PXA-R, PXA-G, and PXA-B may be regions in which lights generated by the light-emitting elements ED1, ED2, and ED3 are emitted, respectively.

For example, the pixel regions PXA-R, PXA-G, and PXA-B include the first pixel region PXA-R, the second pixel region PXA-G, the third pixel region PXA-B, which are disposed to be spaced apart from each other. The light-emitting elements ED1, ED2, and ED3 include the first light-emitting element ED1 that overlaps the first pixel region PXA-R, the second light-emitting element ED2 that overlaps the second pixel region PXA-G, and the third light-emitting element ED3 that overlaps the third pixel region PXA-B.

In the display device DD according to an embodiment, the first light-emitting element ED1, the second light-emitting element ED2, and the third light-emitting element ED3 may emit light having different wavelength regions. For example, the first light-emitting element ED1 may emit red light, the second light-emitting element ED2 may emit green light, and the third light-emitting element ED3 may emit blue light.

The first pixel region PXA-R may be a red light pixel region, the second pixel region PXA-G may be a green light pixel region, and the third pixel region PXA-B may be a blue light pixel region.

However, embodiments are not limited thereto, and the first, second, and third light-emitting elements ED1, ED2, and ED3 may emit light of the same wavelength region, or at least one thereof may emit light of a different wavelength region.

Referring to FIGS. 1 and 2A, the pixel regions PXA-R, PXA-G, and PXA-B in the display device DD according to an embodiment may be arranged in a stripe shape. Referring to FIG. 2A, a plurality of first pixel regions PXA-R, a plurality of second pixel regions PXA-G, and a plurality of third pixel regions PXA-B may be arranged or aligned respectively along a second direction DR2. In addition, the first pixel region PXA-R, the second pixel region PXA-G, and the third pixel region PXA-B may be arranged repeatedly along a first direction DR1.

FIGS. 1 and 2A illustrate that all the pixel regions PXA-R, PXA-G, and PXA-B have the substantially same size (e.g., area), but embodiments are not limited thereto. For example, the sizes (e.g., areas) of the pixel regions PXA-R, PXA-G, and PXA-B may be different from each other according to the wavelength region of the emitted light. For example, the areas of the pixel regions PXA-R, PXA-G, and PXA-B may indicate areas as viewed on a plane defined by the first direction DR1 and the second direction DR2.

For example, an arrangement of the pixel regions PXA-R, PXA-G, and PXA-B is not limited to the configuration illustrated in FIG. 1, and the arrangement order of the first pixel region PXA-R, the second pixel region PXA-G, and the third pixel region PXA-B may be provided in various combinations according to the properties of display quality required for the display device DD. For example, the pixel regions PXA-R, PXA-G, and PXA-B may be arranged in a pentile configuration or a diamond configuration.

The base layer BS may be a member configured to provide a base surface on which the display element layer DP-ED is disposed. The base layer BS may be a glass substrate, a metal substrate, a plastic substrate, or the like. However, embodiments are not limited thereto, and the base layer BS may be an inorganic layer, an organic layer, or a composite material layer.

In an embodiment, the circuit layer DP-CL may be disposed on the base layer BS, and the circuit layer DP-CL may include a plurality of transistors. The transistors may include a control electrode, an input electrode, and an output electrode, respectively. For example, the circuit layer DP-CL may include a switching transistor and a driving transistor for driving the first, second, and third light-emitting elements ED1, ED2, and ED3.

The pixel-defining film PDL may be disposed on the circuit layer DP-CL. The pixel-defining film PDL may be formed of a polymer resin. For example, the pixel-defining film PDL may be formed of a polyacrylate-based resin or a polyimide-based resin. In addition, the pixel-defining film PDL may be formed of an inorganic material in addition to the polymer resin. For example, the pixel-defining film PDL may be formed of a light-absorbing material, or may be formed of a black pigment or a black dye. The pixel-defining film PDL formed of a black pigment or a black dye may implement a black pixel-defining film. Carbon black, or the like may be used as a black pigment or a black dye when forming the pixel-defining film PDL, but embodiments are not limited thereto.

In addition, the pixel-defining film PDL may be formed of an inorganic material. For example, the pixel-defining film PDL may be formed of silicon nitride ($SiN_x$), silicon oxide ($SiO_x$), silicon oxynitride ($SiO_xN_y$), or the like.

The first, second, and third light-emitting elements ED1, ED2, and ED3 may be separated by the pixel-defining film PDL.

Each of the first, second, and third light-emitting elements ED1, ED2, and ED3 may include a first electrode EL1 and a second electrode EL2 that face each other, and a plurality of stacks SF1, SF2, and SF3 stacked in a third direction DR3 between the first electrode EL1 and the second electrode EL2. Each of the plurality of stacks SF1, SF2, and SF3 may include a hole transport region HTR, an emission layer EML, and an electron transport region ETR.

For example, the display device DD according to an embodiment may be an display device having a tandem structure including a plurality of emission layers. In an embodiment, the structures of the first, second, and third light-emitting elements ED1, ED2, and ED3 may all be the same, at least one may be different from the other two, or three structures may all be different. For example, in the display device DD according to an embodiment, the first light-emitting element ED1 and the second light-emitting element ED2 may have the same structure, and the third light-emitting element ED3 may have a different structure from those of the first light-emitting element ED1 and the second light-emitting element ED2. The bank BK may be disposed at the boundary of the third light-emitting element ED3. For example, the bank BK may be disposed between the first light-emitting element ED1 and the third light-emitting element ED3. The bank BK may be disposed between the second light-emitting element ED2 and the third light-emitting element ED3. By the bank BK, the third light-emitting element ED3 may be distinguished from the first light-emitting element ED1 and the second light-emitting element ED2.

In an embodiment, the bank BK may be disposed on the pixel-defining film PDL and overlap the pixel-defining film PDL. The hole transport region HTR, the emission layer EML, the electron transport region ETR, or the like may be patterned and provided by an inkjet printing method, and the bank BK may include a liquid repellent material. Alternatively, the bank BK and the pixel-defining film PDL may include the same material, and may be formed in an integral shape.

An encapsulating layer TFE may be disposed on the first, second, and third light-emitting elements ED1, ED2, and ED3. The encapsulating layer TFE may cover the first, second, and third light-emitting elements ED1, ED2, and ED3. The encapsulating layer TFE may seal the display element layer DP-ED. The encapsulating layer TFE may be a thin film encapsulating layer. The encapsulating layer TFE may be a single layer or a plurality of layers being stacked. The encapsulating layer TFE includes at least one insulating layer. The encapsulating layer TFE according to an embodiment may include at least one inorganic film (hereinafter, an encapsulating inorganic film). In addition, the encapsulating layer TFE according to an embodiment may include at least one organic film (hereinafter, an encapsulating organic film) and at least one encapsulating inorganic film.

The encapsulating inorganic film protects the display element layer DP-ED from moisture/oxygen, and the encapsulating organic film protects the display element layer DP-ED from foreign materials such as dust particles. The encapsulating inorganic film may include silicon nitride, silicon oxy nitride, silicon oxide, titanium oxide, aluminum oxide, or the like, but embodiments are not limited thereto. The encapsulating organic film may include an acrylic-based compound, an epoxy-based compound, or the like. The encapsulating organic film may include a photopolymerizable organic material, but embodiments are not limited thereto.

The upper display substrate 200 may be disposed on the encapsulating layer TFE. The upper display substrate 200 may include a base substrate BL, a color filter layer CFL, and a light control layer CCL.

The light control layer CCL may be disposed on the display panel 100. The light control layer CCL may include a light conversion body. The light conversion body may be a quantum dot, a phosphor, or the like. The light conversion body may convert the wavelength of received light to emit the converted light. For example, the light control layer CCL may be a layer including a quantum dot or a layer including a phosphor.

The light control layer CCL may include a plurality of light control portions CCP1, CCP2, and CCP3.

The light control portions CCP1, CCP2, and CCP3 may be spaced apart from each other. As shown, a division pattern BMP may be disposed between the light control portions CCP1, CCP2, and CCP3 which are spaced apart from each other, but embodiments are not limited thereto. For example, FIG. 2A illustrates that the division pattern BMP does not overlap the light control portions CCP1, CCP2, and CCP3, but embodiments are not limited thereto. For example, at least part of edges of the light control portions CCP1, CCP2, and CCP3 may overlap the division pattern BMP.

In an embodiment, the light control layer CCL may include the first light control portion CCP1, the second light control portion CCP2, and the third light control portion CCP3 which are configured to transmit or convert light provided by the display panel 100. For example, the first light control portion CCP1 may include a first quantum dot QD1 configured to convert second light or third light into first light. The second light control portion CCP2 may include a second quantum dot QD2 configured to convert third light into second light. The third light control portion CCP3 may transmit third light without converting the third light.

For example, the quantum dot may include, as a core, II-VI compounds, III-VI compounds, I-III-VI compounds, III-V compounds, III-II-V compounds, IV-VI compounds, Group IV elements, IV compounds, and a combination thereof.

II-VI compounds may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

III-VI compounds may include a binary compound such as $In_2S_3$ and $In_2Se_3$, a ternary compound such as $InGaS_3$ and $InGaSe_3$, or any combination thereof.

I-III-VI compounds may be selected from a ternary compound selected from the group consisting of $AgInS$, $AgInS_2$, $CuInS$, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

III-V compounds may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. For example, III-V compounds may further include a Group II metal. For example, InZnP, InGaZnP, InAlZnP, or the like may be selected as III-II-V compounds.

IV-VI compounds may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. Group IV elements may be selected from the group consisting of Si, Ge, and a mixture thereof. IV compounds may be a binary compound selected from the group consisting of SiC, SiGe, and a mixture thereof.

In this case, a binary compound, a ternary compound, or a quaternary compound may be present in the particle at a uniform concentration, or may be present in the same particle while being divided to have partially different concentration distribution. In addition, these compounds may have a core/shell structure in which one quantum dot surrounds another quantum dot. The core/shell structure may have a concentration gradient in which a concentration of an element present in the shell gradually decreases toward the core.

The shell of the quantum dot may serve as a protective layer for maintaining characteristics of a semiconductor by preventing chemical modification of the core and/or a charging layer for imparting electrophoretic characteristics to the quantum dot. The shell may be a single layer or multiples layers. Examples of the shell of the quantum dot may include a metal or non-metal oxide, a semiconductor compound, or a combination thereof.

For example, the metal or non-metal oxide may be illustrated as a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

In addition, the semiconductor compound may be exemplified as, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but embodiments are not limited thereto.

The quantum dot may have a full width of half maximum (FWHM) of an emission wavelength spectrum of about 45 nm or less, preferably about 40 nm or less, more preferably about 30 nm or less, and color purity or color gamut may be improved in this range. In addition, as light emitted through this quantum dot is emitted in all directions, an improved wide viewing angle may be obtained.

In addition, the shape of the quantum dot is generally used typical shapes, but embodiments are not limited thereto. For example, the shape of the quantum dot may include pyramidal, multi-arm, or cubic nanoparticles, nanotubes, nanowires, nanofibers, plate-shaped nanoparticles, or the like.

The quantum dot may control the color of emitted light according to the particle size, and thus, the quantum dots may have various light-emitting colors such as red, green, blue, or the like.

For example, the first quantum dot QD1 included in the first light control portion CCP1 may be a red quantum dot, and the second quantum dot QD2 included in the second light control portion CCP2 may be a green quantum dot. For example, the third light control portion CCP3 may not include any quantum dot. However, embodiments are not limited thereto, and the third light control portion CCP3 may include a quantum dot.

For example, the light control layer CCL may include a scatterer SP. The first light control portion CCP1 may include at least one of the first quantum dot QD1 or the scatterer SP, the second light control portion CCP2 may include at least one of the second quantum dot QD2 and the scatterer SP, and the third light control portion CCP3 may include the scatterer SP.

The scatterer SP may be an inorganic particle. For example, the scatterer SP may include at least one of TiO2, ZnO, Al$_2$O$_3$, SiO$_2$, or hollow silica. The scatterer SP may include at least one of TiO$_2$, ZnO, Al$_2$O$_3$, SiO$_2$, or hollow silica, or may be a mixture of two or more materials selected from TiO$_2$, ZnO, Al$_2$O$_3$, SiO$_2$, and hollow silica.

The first light control portion CCP1, the second light control portion CCP2, and the third light control portion CCP3 may respectively include base resins BR1, BR2, and BR3 which disperse the quantum dots QD1 and QD2, and the scatterer SP. In an embodiment, the first light control portion CCP1 may include the first quantum dot QD1 and the scatterer SP dispersed in the first base resin BR1, the second light control portion CCP2 may include the second quantum dot QD2 and the scatterer SP dispersed in the second base resin BR2, and the third light control portion CCP3 may include the scatterer SP dispersed in the third base resin BR3.

The base resins BR1, BR2, and BR3 are media in which the quantum dots QD1 and QD2 and the scatterer SP are dispersed, and may be made of various resin compositions which may be generally referred to as binders. For example, the base resins BR1, BR2, and BR3 may be acrylic-based resins, urethane-based resins, silicone-based resins, epoxy-based resins, or the like. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to prevent penetration of moisture and/or oxygen (hereinafter referred to as "moisture/oxygen"). The barrier layer BFL1 may be disposed on the light control portions CCP1, CCP2, and CCP3 to prevent the light control portions CCP1, CCP2, and CCP3 from being exposed to moisture/oxygen. For example, the barrier layer BFL1 may cover the light control portions CCP1, CCP2, and CCP3. In addition, a barrier layer BFL2 may be provided between the light control portions CCP1, CCP2, and CCP3 and the color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may be formed of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or a metal thin film in which light transmittance is secured. For example, the barrier layers BFL1 and BFL2 may further include an organic film. The barrier layers BFL1 and BFL2 may be comprised of a single layer or a plurality of layers.

In a display device DD according to an embodiment, the color filter layer CFL may be disposed on the light control layer CCL. For example, the color filter layer CFL may be directly disposed on the light control layer CCL.

In this case, the barrier layer BFL2 may be omitted. The color filter layer CFL may include a light-shielding portion BM and color filters CF1, CF3, and CF3. Specifically, the color filter layer CFL may include the first color filter CF1 configured to selectively transmit first light, the second color filter CF2 configured to selectively transmit second light, and the third color filter CF3 configured to selectively transmit third light. For example, the first color filter CF1 may be a red color filter, the second color filter CF2 may be a green color filter, and the third color filter CF3 may be a blue color filter. Each of the first, second, and third color filters CF1, CF2, and CF3 may include a polymer photosensitive resin and a pigment or dye. The first color filter CF1 may include a red pigment or dye, the second color filter CF2 may include a green pigment or dye, and the third color filter CF3 may include a blue pigment or dye. However, embodiments are not limited thereto. For example, the third color filter CF3 may not include a pigment or dye. The third color filter CF3 may include a polymer photosensitive resin and may not include a pigment or dye.

The light-shielding portion BM may be a black matrix. The light-shielding portion BM may be formed of an organic light-shielding material or an inorganic light-shielding material including a black pigment or a black dye. The light-shielding portion BM may prevent light leakage, and separate the boundary between the adjacent color filters CF1, CF2, and CF3. In addition, in an embodiment, the light-shielding portion BM may be formed of a blue matrix.

The first, second, and third color filters CF1, CF2, and CF3 may be disposed to respectively correspond to the first pixel region PXA-R, the second pixel region PXA-G, and the third pixel region PXA-B.

The base substrate BL may provide a base surface on which the color filter layer CFL, the light control layer CCL, or the like are disposed. The base substrate BL may be a glass substrate, a metal substrate, a plastic substrate, or the like. However, embodiments are not limited thereto, and the base substrate BL may be an inorganic layer, an organic layer, or a composite material layer. In addition, unlike the illustration, the base substrate BL may be omitted in an embodiment. When the base substrate BL is omitted, the light control layer CCL and the color filter layer CFL may be sequentially stacked on the display panel 100.

For example, the configuration of the upper display substrate 200 is not limited thereto, and for example, the upper display substrate 200 may further include a polarization layer, or the color filter layer CFL may be omitted. The polarization layer may block external light incident on the display device DD from the outside. For example, the polarization layer may function to block reflected light when light incident from the outside of the display device DD enters the display panel 100 and exits again.

Figure 2B:
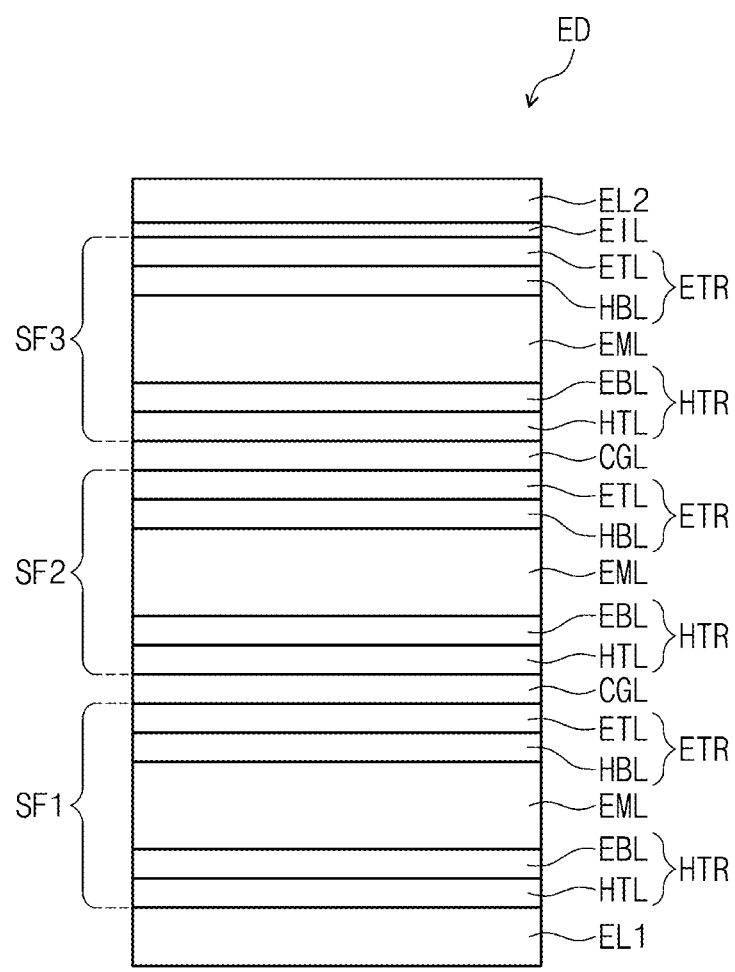
FIG. 2B shows a cross-sectional view illustrating one of the light-emitting elements of FIG. 2A.

FIG. 2B shows a cross-sectional view of a light-emitting element ED according to an embodiment.

Referring to FIG. 2B, each of the first, second, and third light-emitting elements ED1, ED2, and ED3 according to an embodiment may have a structure of the illustrated light-emitting element ED.

The light-emitting element ED may include a first electrode EL1, a second electrode EL2, and a plurality of stacks SF1, SF2, and SF3 stacked between the first electrode EL1 and the second electrode EL2. In an embodiment, two or more of the plurality of stacks may be provided. FIG. 2B illustrates a light-emitting element ED in which three stacks are provided. Specifically, the light-emitting element ED may include the first electrode EL1, the first floor stack SF1, the second floor stack SF2, the third floor stack SF3, and the second electrode EL2. However, embodiments are not limited thereto, and the light-emitting element ED may include two stacks or four or more stacks.

Each of the first, second, and third floor stacks SF1, SF2, and SF3 may include a hole transport region HTR, an emission layer EML, and an electron transport region ETR. A charge generating layer CGL may be disposed between adjacent stacks among the first, second, and third floor stacks SF1, SF2, and SF3. The charge generating layer CGL may include a p-type charge generating layer and/or an n-type charge generating layer. The charge generating layer CGL may promote the movement of holes and/or charges.

The first electrode EL1 has conductivity. The first electrode EL1 may be formed of a metal material, a metal alloy, or a conductive compound. The first electrode EL1 may be an anode or a cathode. However, embodiments are not limited thereto. In addition, the first electrode EL1 may be a pixel electrode. The first electrode EL1 may be a transmissive electrode, a transflective electrode, or a reflective electrode. When the first electrode EL1 is the transmissive electrode, the first electrode EL1 may include transparent metal oxide such as indium tin oxide (ITO), indium zinc oxide (IZO), zinc oxide (ZnO), indium tin zinc oxide (ITZO), or the like. When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, or a compound or a mixture thereof (for example, a mixture of Ag and Mg). Alternatively, the first electrode EL1 may have a multilayered structure including a reflective film or a transflective film formed of the above-described materials and a transparent conductive film formed of indium tin oxide (ITO), indium zinc oxide (IZO), zinc oxide (ZnO), indium tin zinc oxide (ITZO), or the like. For example, the first electrode EL1 may have a three-layer structure of ITO/Ag/ITO, but embodiments are not limited thereto. In addition, the first electrode EL1 may include the above-described metal material, a combination of two or more metal materials selected from the above-described metal materials, or an oxide of the above-described metal materials. A thickness of the first electrode EL1 may be about 700 Å to about 10000 Å. For example, the thickness of the first electrode EL1 may be about 1000 Å to about 3000 Å.

The hole transport region HTR is provided on the first electrode EL1. The hole transport region HTR may include at least one of a hole transport layer HTL or an electron blocking layer EBL. However, embodiments are not limited thereto, and the hole transport region HTR may further include a hole injection layer, a buffer layer or a light-emitting auxiliary layer. The thickness of the hole transport region HTR may be, for example, about 50 Å to about 15,000 Å.

The hole transport region HTR may have a single layer formed of a single material, a single layer formed of a plurality of different materials, or a multilayer structure having a plurality of layers formed of a plurality of different materials.

For example, the hole transport region HTR may have a structure of a single layer of a hole injection layer or a hole transport layer, and may have a structure of a single layer formed of a hole injection material and a hole transport material. Further, the hole transport region HTR may have a structure of a single layer formed of a plurality of different materials, or a structure in which a hole injection layer/hole transport layer, a hole injection layer/hole transport layer/buffer layer, a hole injection layer/buffer layer, a hole transport layer/buffer layer, or a hole injection layer/hole transport layer/electron blocking layer which are stacked in order from the first electrode EL1, but embodiments are not limited thereto.

The hole transport region HTR may be formed by using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

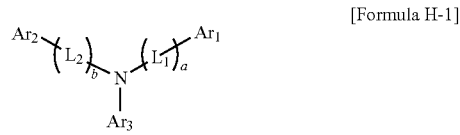

[Formula H-1]

In Formula H-1 above, $L_1$ and $L_2$ may be each independently a direct linkage, a substituted or unsubstituted ring-forming arylene group having 6 to 30 carbon atoms, or a substituted or unsubstituted ring-forming heteroarylene group having 2 to 30 carbon atoms. "a" and "b" are each independently an integer of 0 to 10. For example, when "a" or "b" is an integer of 2 or more, a plurality of $L_1$ and $L_2$ may be each independently a substituted or unsubstituted ring-forming arylene group having 6 to 30 carbon atoms, or a substituted or unsubstituted ring-forming heteroarylene group having 2 to 30 carbon atoms.

In Formula H-1, $Ar_1$ and $Ar_2$ may be each independently a substituted or unsubstituted ring-forming aryl group having 6 to 30 carbon atoms, or a substituted or unsubstituted ring-forming heteroaryl group having 2 to 30 carbon atoms. In addition, in Formula H-1, $Ar_3$ may be a substituted or unsubstituted ring-forming aryl group having 6 to 30 carbon atoms.

The compound represented by Formula H-1 above may be a monoamine compound. Alternatively, the compound represented by Formula H-1 above may be a diamine compound in which at least one among $Ar_1$, $Ar_2$, and $Ar_3$ includes an amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one among the compounds in Compound Group H below. However, the compounds listed in Compound Group H below are illustrative, and the compound represented by Formula H-1 is not limited to those represented in Compound Group H below.
[Compound Group H]
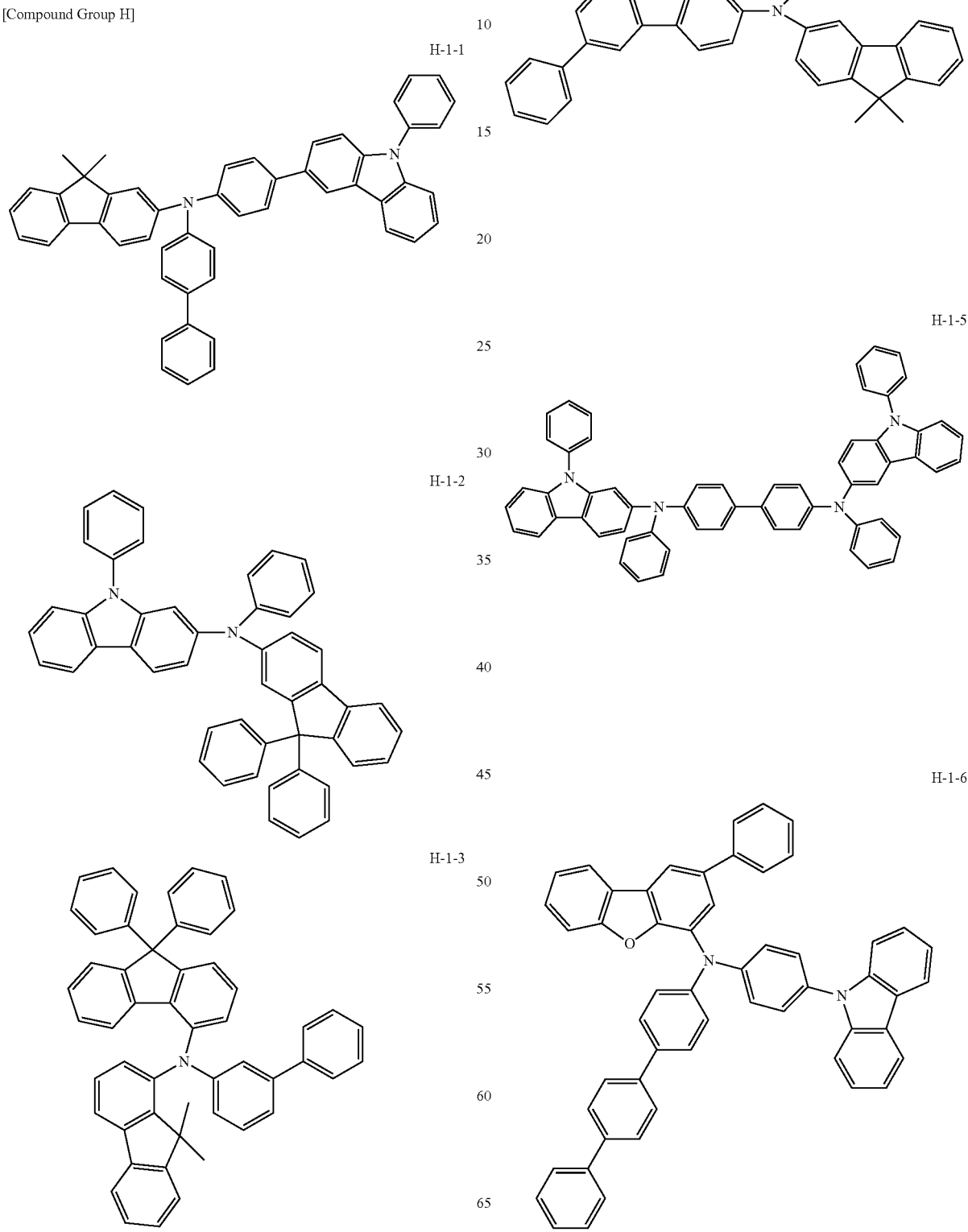

H-1-7
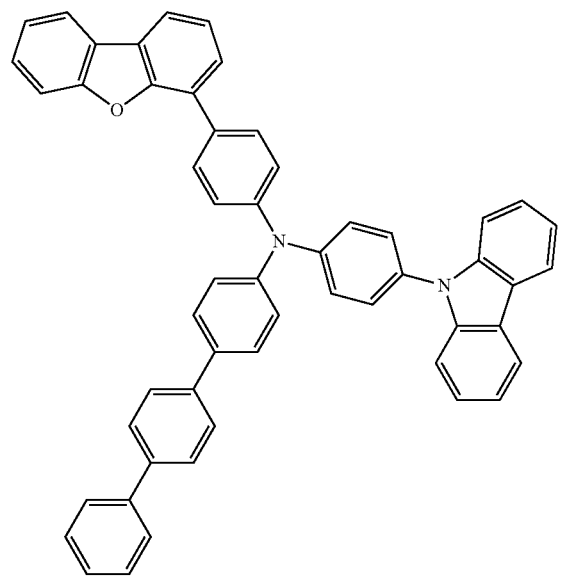
H-1-8
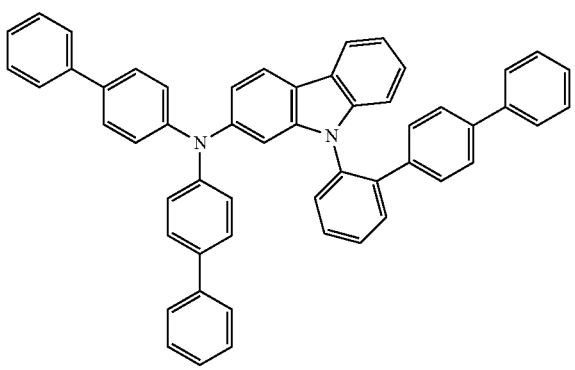
H-1-9
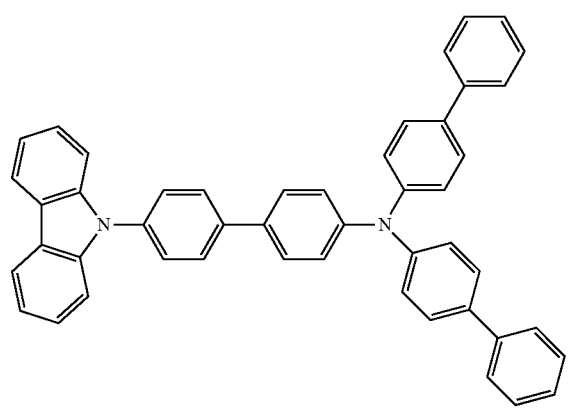
H-1-10
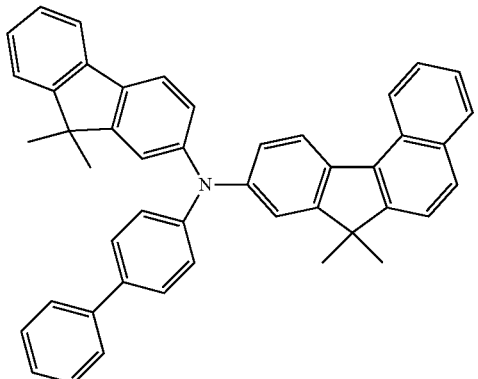
H-1-11
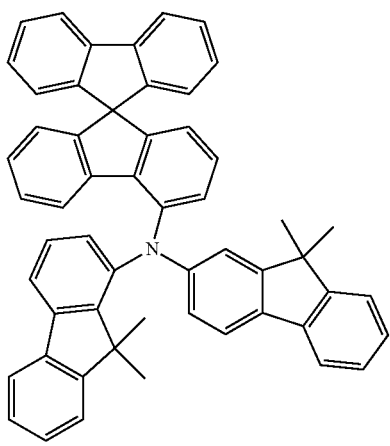
H-1-12
H-1-13
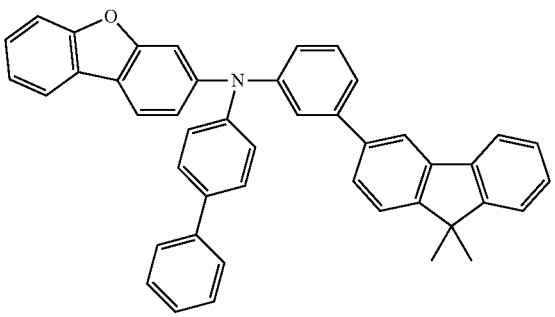

H-1-14
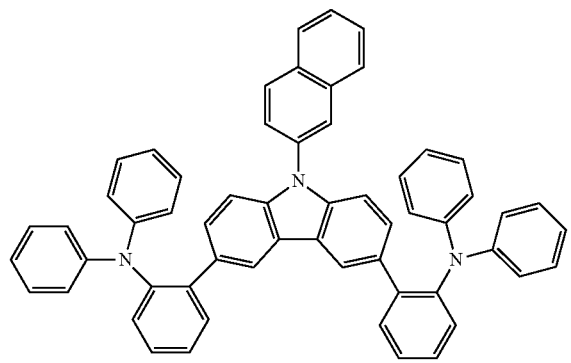
H-1-15
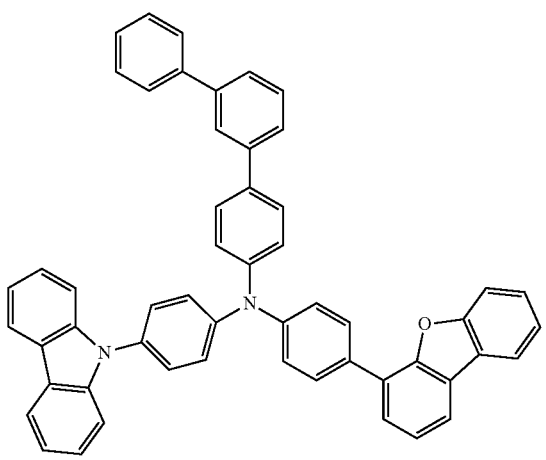
H-1-16
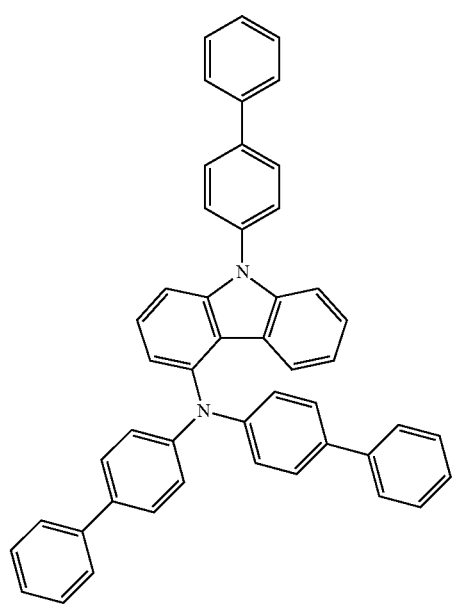
H-1-17
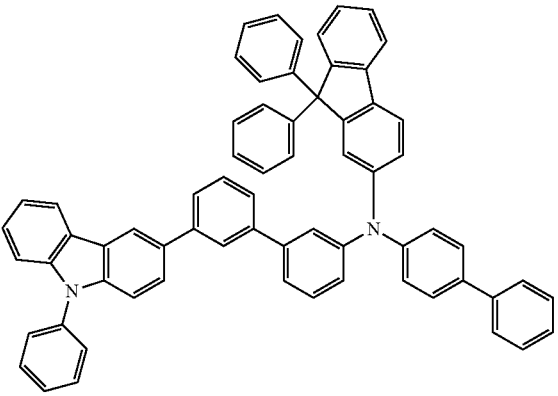
H-1-18
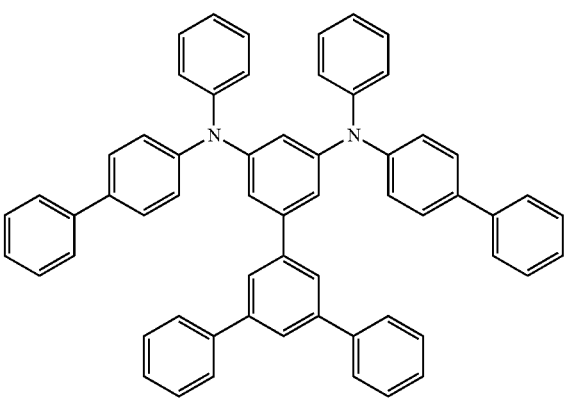
H-1-19
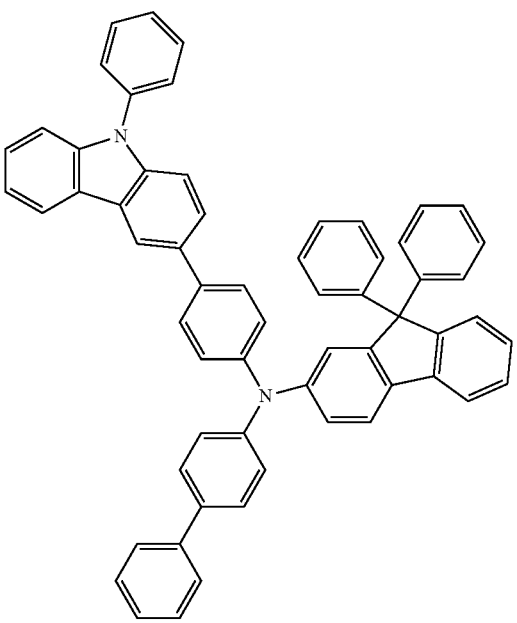
The hole transport region HTR may include a phthalocyanine compound such as copper phthalocyanine, N1,N1'-([1,1'-biphenyl]-4,4'-diyl)bis(N1-phenyl-N4,N4-di-m-tolyl-benzene-1,4-diamine) (DNTPD), 4,4',4''-[tris(3-methylphenyl)phenylamino] triphenylamine (m-MTDATA), 4,4'4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h] quinoxaline-2,3,6,7,10,11-hexacarbonitrile (HATCN), or the like.

The hole transport region HTR may include a carbazole-based derivative such as N-phenyl carbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), or the like.

In addition, the hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), or the like.

The hole transport region HTR may include the aforementioned compounds of the hole transport region in at least one of the hole injection layer, the hole transport layer, or the electron blocking layer.

A thickness of the hole transport region HTR may be about 100 Å to about 10000 Å, for example, about 100 Å to about 5000 Å. When the hole transport region HTR includes the hole injection layer, the thickness of the hole injection layer may be, for example, about 30 Å to about 1000 Å.

When the hole transport region HTR includes the hole transport layer, the thickness of the hole transport layer may be about 30 Å to about 1000 Å. For example, when the hole transport region HTR includes the electron blocking layer, the thickness of the electron blocking layer may be about 10 Å to about 1000 Å. When the thicknesses of the hole transport region HTR, the hole injection layer, the hole transport layer, and the electron blocking layer satisfy the above-described ranges, satisfactory hole transport properties may be obtained without substantial increase of a driving voltage.

The hole transport region may further include a charge generating material in addition to the above-described materials to improve conductivity. The charge generating material may be uniformly or non-uniformly dispersed in the hole transport region HTR. The charge generating material may be, for example, a p-type dopant. The p-type dopant may include at least one among a halogenated metal compound, a quinone derivative, a metal oxide, and a cyano group-containing compound, but embodiments are not limited thereto. For example, the p-type dopant may include a halogenated metal compound such as CuI and RbI, a quinone derivative such as tetracyanoquinodimethane (TCNQ) and 2,3,5,6-tetrafluoro-7,7',8,8-tetracyanoquinodimethane (F4-TCNQ), a metal oxide such as tungsten oxide and molybdenum oxide, a cyano group-containing compound such as dipyrazino[2,3-f: 2',3'-h] quinoxaline-2,3,6,7,10,11-hexacarbonitrile (HAT-CN) and 4-[[2,3-bis[cyano-(4-cyano-2,3,5,6-tetrafluorophenyl)methylene]cyclopropylidene]-cyanomethyl]-2,3,5,6-tetrafluorobenzonitrile (NDP-9), but embodiments are not limited thereto.

As described above, the hole transport region HTR may further include at least one of the buffer layer or the electron blocking layer in addition to the hole injection layer and the hole transport layer. The buffer layer may compensate an optical resonance distance according to the wavelength of light emitted from the emission layer EML to increase light-emitting efficiency. A material which may be included in the hole transport region HTR may be used as a material included in the buffer layer. The electron blocking layer is a layer that serves to prevent the electron injection from the electron transport region ETR to the hole transport region HTR.

The emission layer EML is provided on the hole transport region HTR. The emission layer EML may have a thickness of, for example about 100 Å to about 1000 Å, or about 100 Å to about 300 Å. The emission layer EML may have a single layer formed of a single material, a single layer formed of a plurality of different materials, or a multilayer structure having a plurality of layers formed of a plurality of different materials.

In the light-emitting element ED according to an embodiment, the emission layer EML may include an anthracene derivative, a pyrene derivative, a fluoranthene derivative, a chrysene derivative, a dihydrobenzanthracene derivative, or a triphenylene derivative. Specifically, the emission layer EML may include an anthracene derivative or a pyrene derivative.

In the light-emitting element ED according to an embodiment, the emission layer EML may include a host and a dopant, and the emission layer EML may include the compound represented by Formula E-1 below. The compound represented by Formula E-1 below may be used as a fluorescent host material.

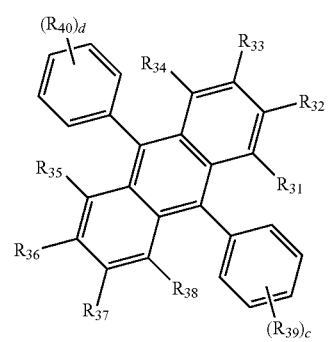

[Formula E-1]

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring. For example, $R_{31}$ to $R_{40}$ may be combined with an adjacent group to form a saturated hydrocarbon ring or an unsaturated hydrocarbon ring.

In Formula E-1, "c" and "d" may be each independently an integer of 0 to 5.

Formula E-1 may be represented by any one among Compound E1 to Compound E19 below.

E1
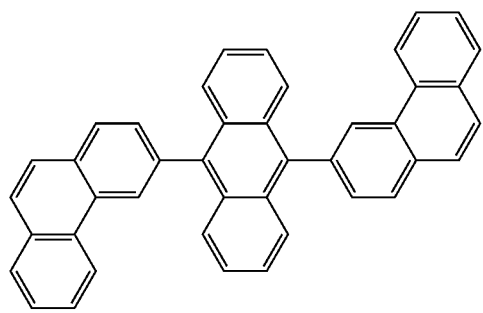
E2
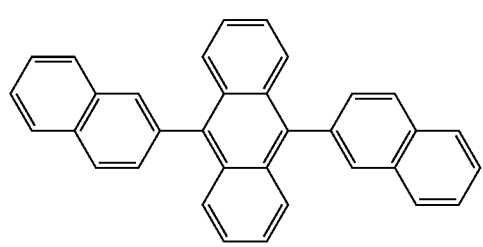
E3
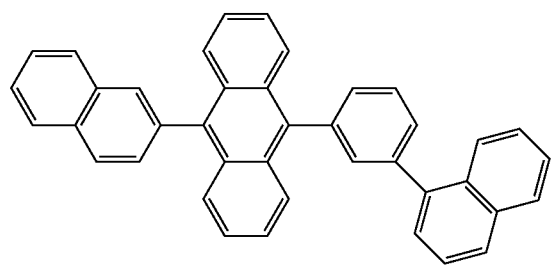
E4
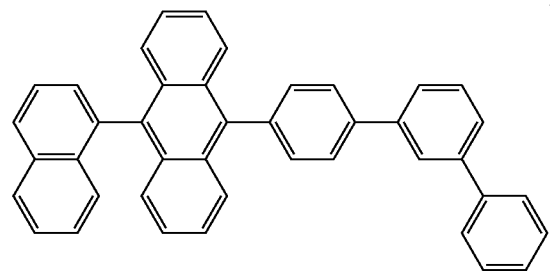
E5
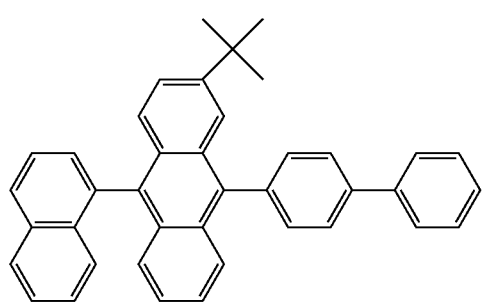
E6
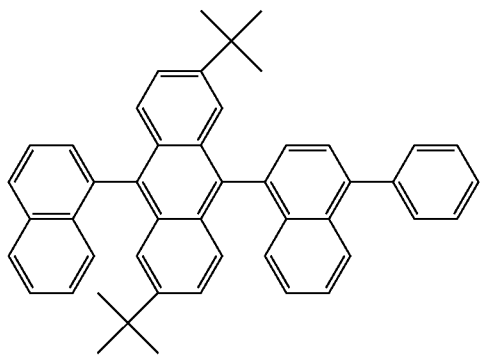
E7
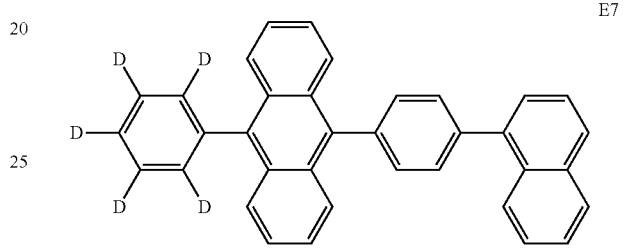
E8
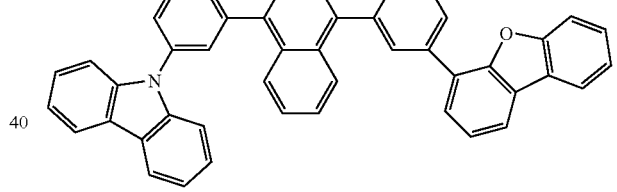
E9
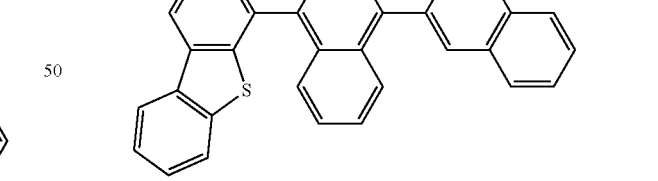
E10
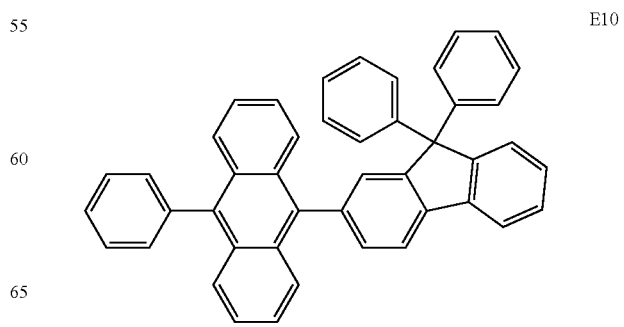

E11
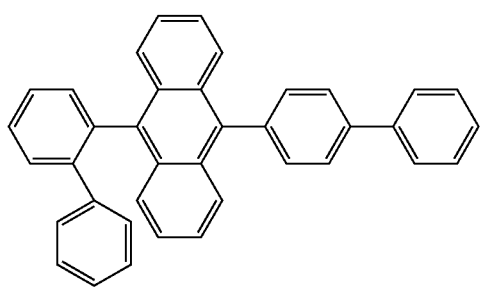
E12
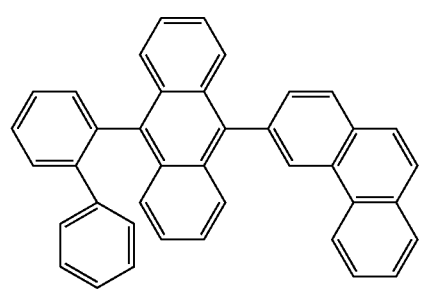
E13
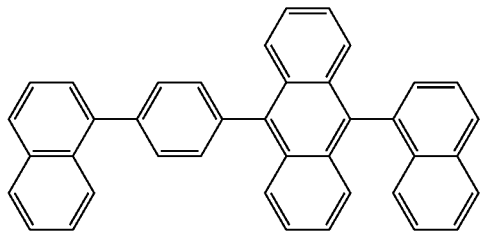
E14
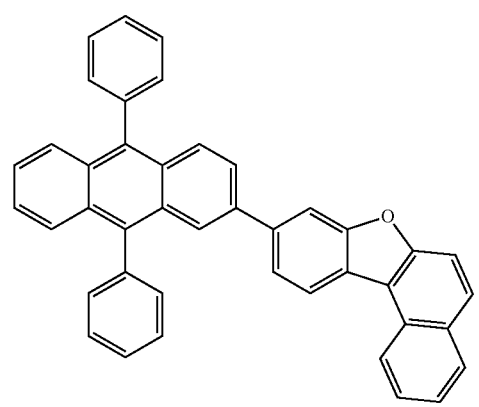
E15
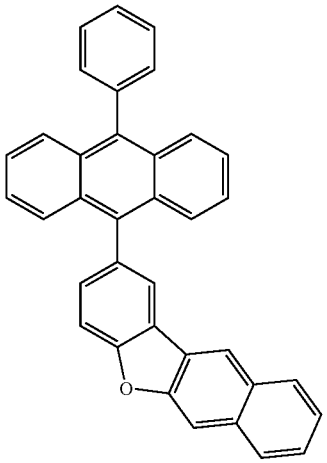
E16
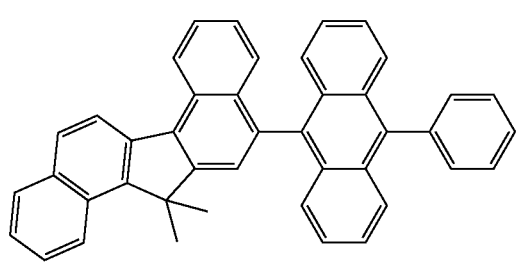
E17
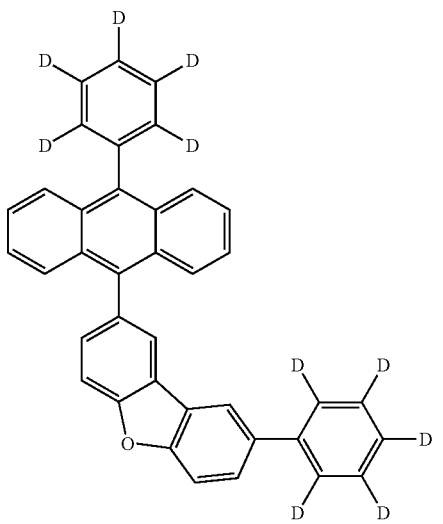
E18
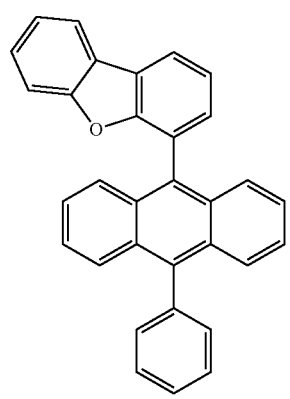

E19

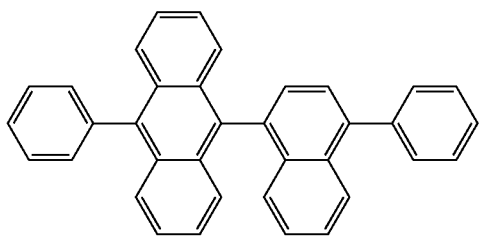

In an embodiment, the emission layer EML may include the compound represented by Formula E-2a or Formula E-2b below. The compound represented by Formula E-2a or Formula E-2b below may be used as a phosphorescent host material.

[Formula E-2a]

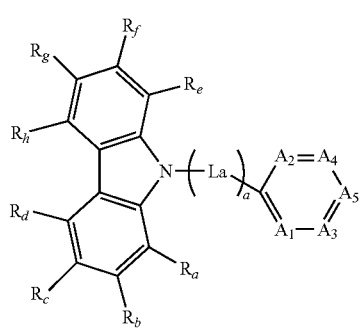

In Formula E-2a, "a" may be an integer of 0 to 10, and La may be a direct linkage, a substituted or unsubstituted ring-forming arylene group having 6 to 30 carbon atoms, or a substituted or unsubstituted ring-forming heteroarylene group having 2 to 30 carbon atoms. For example, when "a" is an integer of 2 or more, a plurality of La may be each independently a substituted or unsubstituted ring-forming arylene group having 6 to 30 carbon atoms, or a substituted or unsubstituted ring-forming heteroarylene group having 2 to 30 carbon atoms.

In addition, in Formula E-2a, $A_1$ to $A_5$ may be each independently N or CRi. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring. $R_a$ to $R_i$ may combined with an adjacent group to form hydrocarbon ring or hetero ring including N, O, S, or the like as a ring-forming atom.

For example, in Formula E-2a, two or three selected among $A_1$ to $A_5$ may be N, and the remainder may be CRi.

[Formula E-2b]

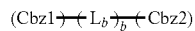

In Formula E-2b, Cbz1 and Cbz2 may be each independently an unsubstituted carbazole group, or a carbazole group substituted with a ring-forming aryl group having 6 to 30 carbon atoms. Lb may be a direct linkage, a substituted or unsubstituted ring-forming arylene group having 6 to 30 carbon atoms, or a substituted or unsubstituted ring-forming heteroarylene group having 2 to 30 carbon atoms. When "b" is an integer of 0 to 10, and "b" is an integer of 2 or more, a plurality of Lb may be each independently a substituted or unsubstituted ring-forming arylene group having 6 to 30 carbon atoms, or a substituted or unsubstituted ring-forming heteroarylene group having 2 to 30 carbon atoms.

The compound represented by Formula E-2a or Formula E-2b may be represented by any one among the compounds in Compound Group E-2 below. However, the compounds listed in Compound Group E-2 below are illustrative, and the compound represented by Formula E-2a or Formula E-2b is not limited to those represented in Compound Group E-2 below.

[Compound Group E-2]

E-2-1

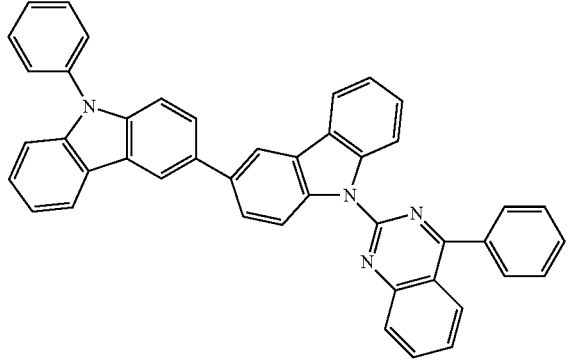

E-2-2

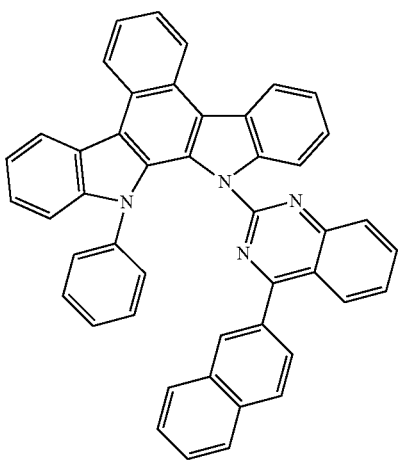

E-2-3

E-2-4

E-2-5

E-2-6

E-2-7

E-2-8

E-2-9
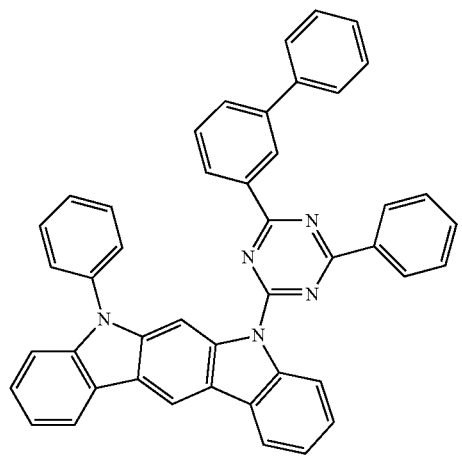
E-2-10
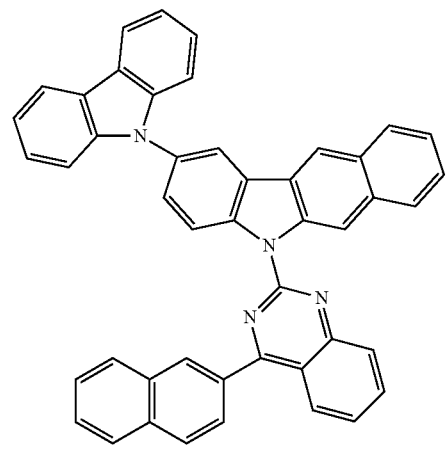
E-2-11
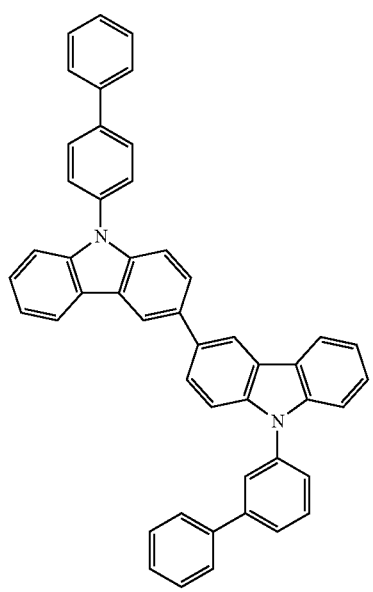
E-2-12
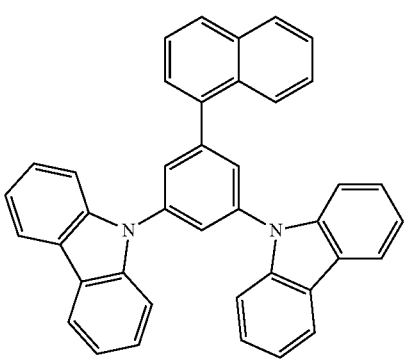
E-2-13
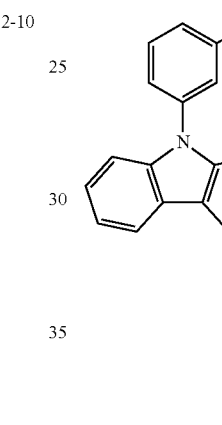
E-2-14
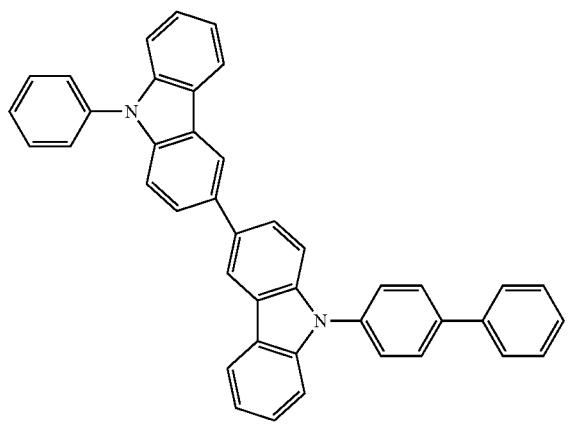

E-2-15
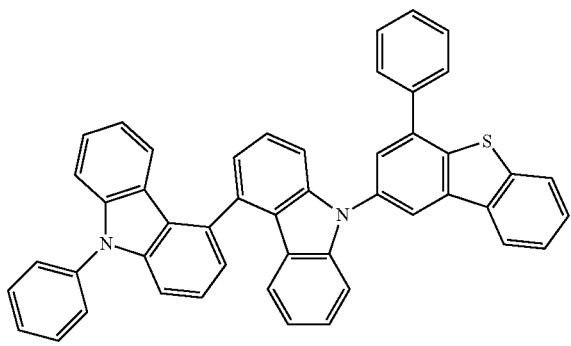
E-2-16
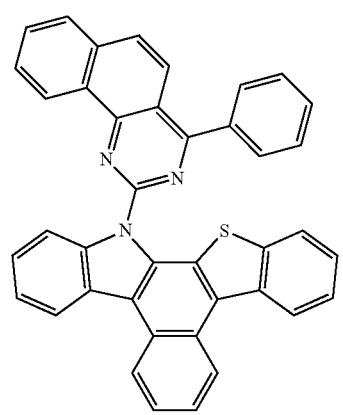
E-2-17
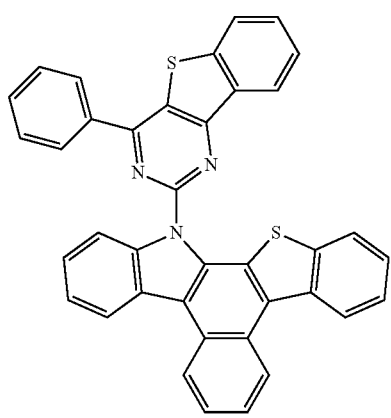
E-2-18
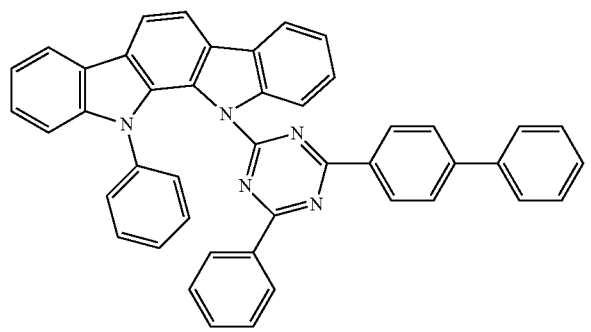
E-2-19
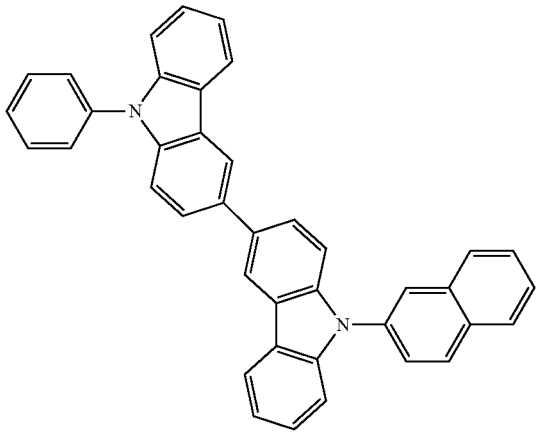
E-2-20
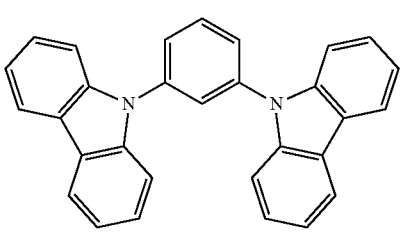
E-2-21
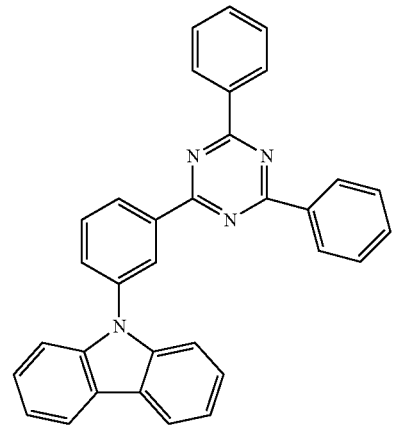
E-2-22
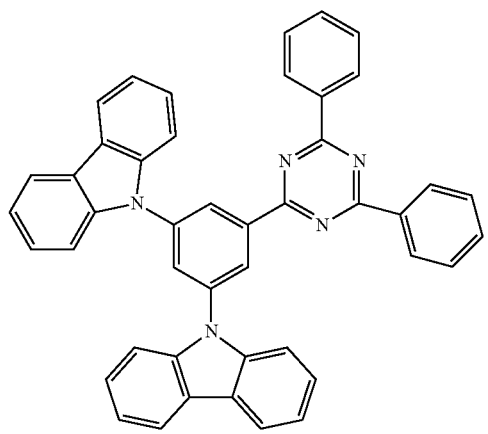

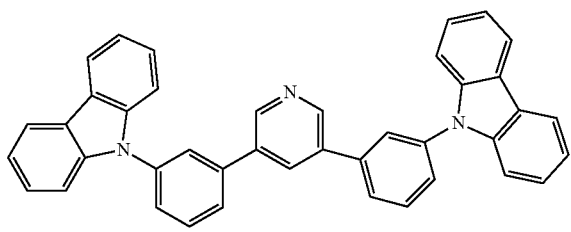

E-2-23

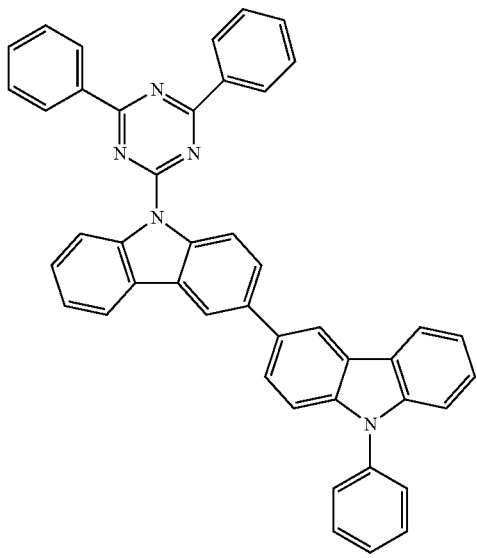

E-2-24

The emission layer EML may include a common material as a host material. For example, the emission layer EML may include at least one among bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazol-2-yl)benzene (TPBi) as the host material. However, embodiments are not limited thereto, and for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO₃), octaphenylcyclotetrasiloxane (DPSiO₄), 2,8-bis(diphenylphosphoryl)dibenzofuran (PPF), or the like may be used as the host material.

The emission layer EML may include the compound represented by Formula M-a or Formula M-b below. The compound represented by Formula M-a or Formula M-b below may be used as a phosphorescent dopant material.

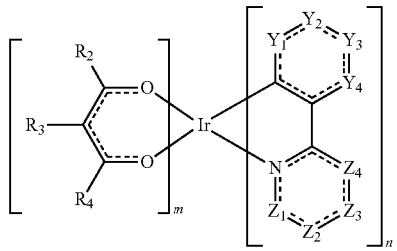

[Formula M-a]

In Formula M-a above, $Y_1$ to $Y_4$, and $Z_1$ to $Z_4$ may be each independently CR1 or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring. In Formula M-a, "m" is 0 or 1, and "n" is 2 or 3. In Formula M-a, when "m" is 0, "n" is 3, and when "m" is 1, "n" is 2.

The compound represented by Formula M-a may be used as a red phosphorescent dopant or a green phosphorescent dopant.

The compound represented by Formula M-a may be represented by any one among Compounds M-a1 to M-a19 below. However, Compounds M-a1 to M-a19 below are illustrative, and the compound represented by Formula M-a is not limited to those represented by Compounds M-a1 to M-a19 below.

M-a1

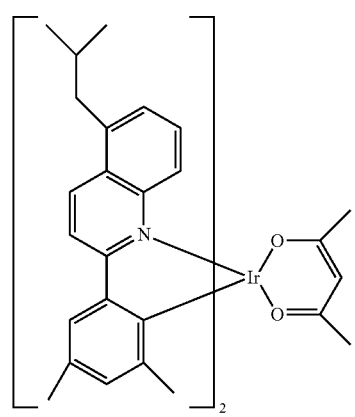

M-a2
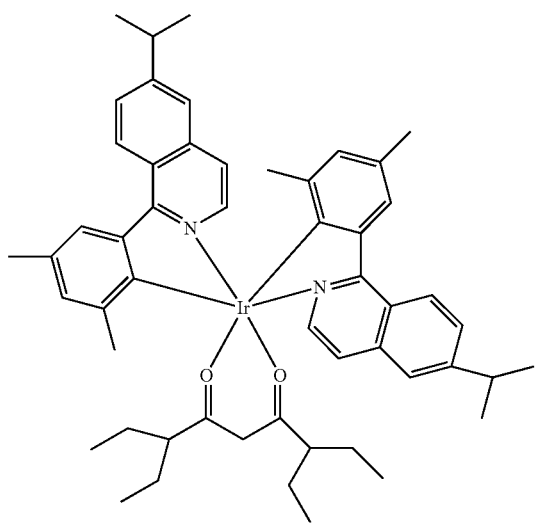
M-a3
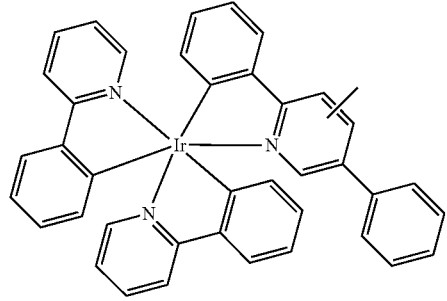
M-a4
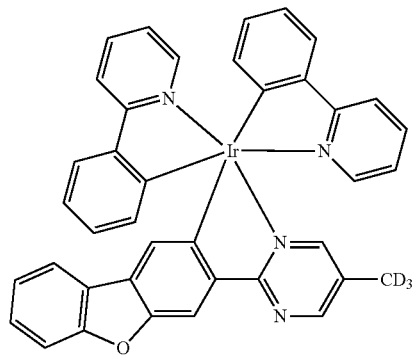
M-a5
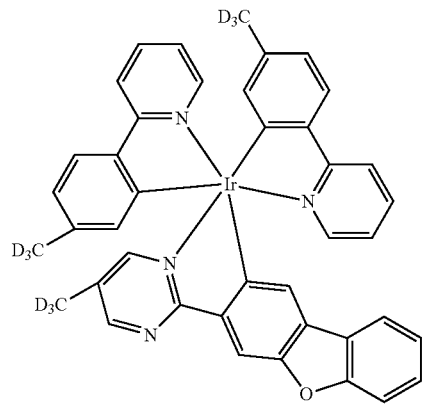
M-a6
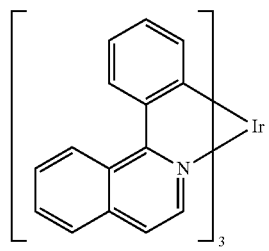
M-a7
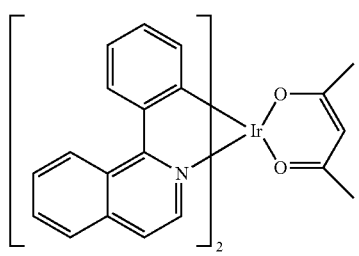
M-a8
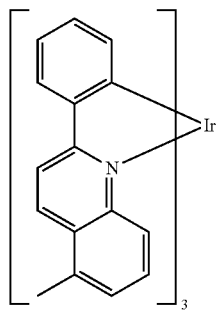
M-a9
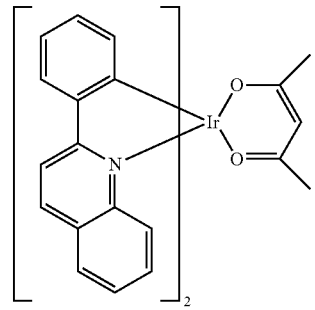
M-a10
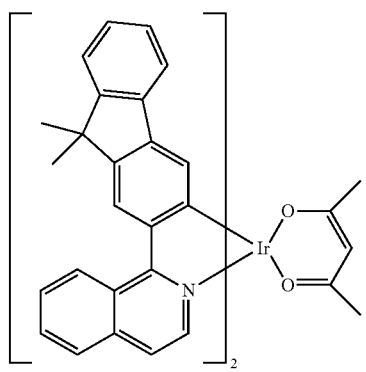

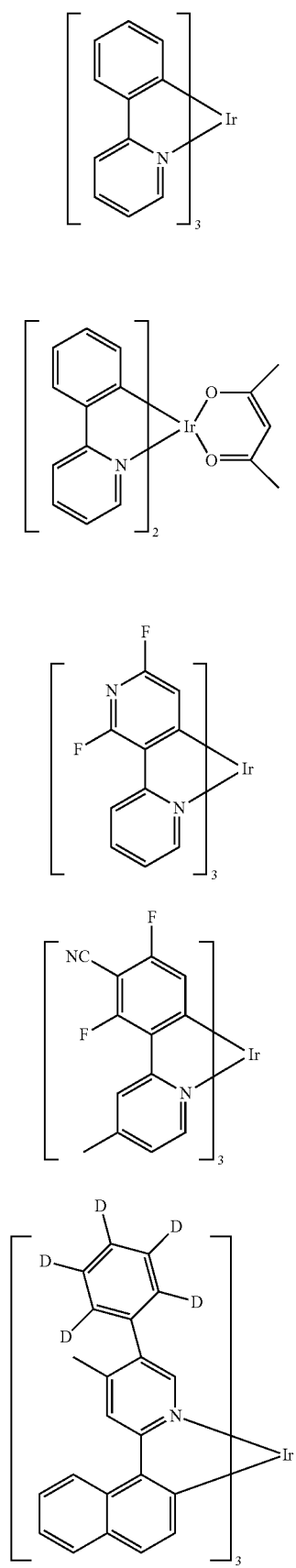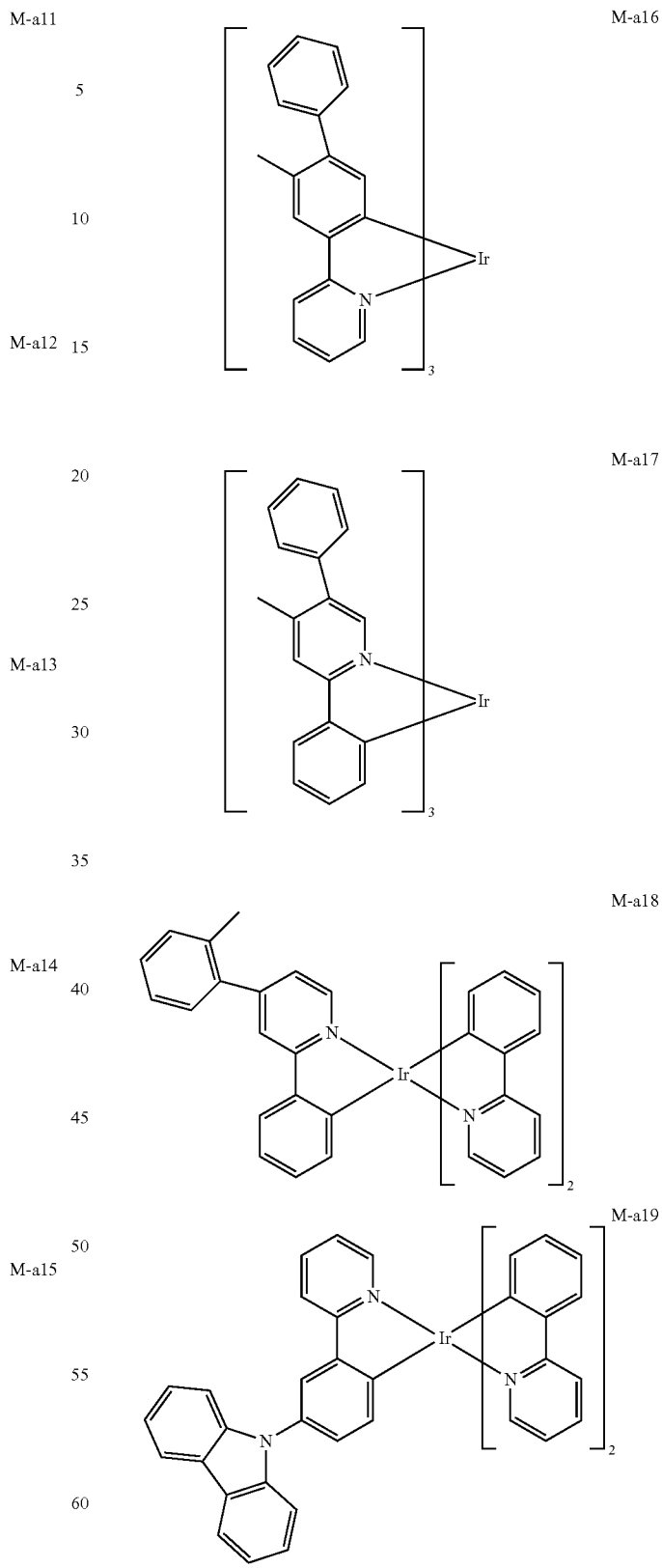
Compounds M-a1 and M-a2 may be used as a red dopant material, and Compounds M-a3 to M-a5 may be used as a green dopant material.

[Formula M-b]

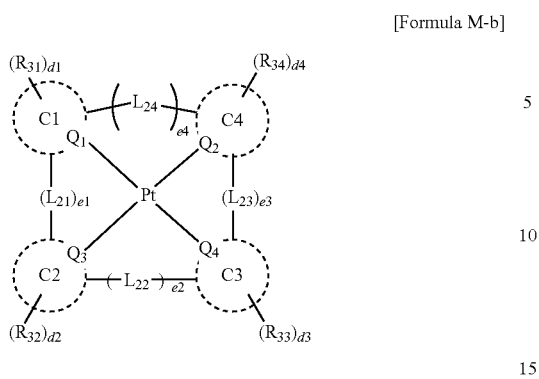

In Formula M-b, $Q_1$ to $Q_4$ are each independently C or N, and $C_1$ to $C_4$ are each independently a substituted or unsubstituted ring-forming hydrocarbon ring having 5 to 30 carbon atoms, or a substituted or unsubstituted ring-forming heterocycle having 2 to 30 carbon atoms. $L_{21}$ to $L_{24}$ are each independently a direct linkage,

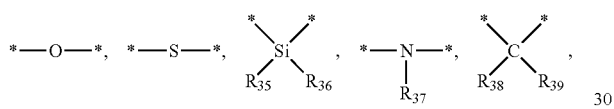

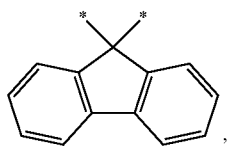

a substituted or unsubstituted divalent alkyl group having 1 to 20 carbon atoms, a substituted or unsubstituted ring-forming arylene group having 6 to 30 carbon atoms, or a substituted or unsubstituted ring-forming heteroarylene group having 2 to 30 carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring, and d1 to d4 are each independently an integer of 0 to 4.

The compound represented by Formula M-b may be used as a blue phosphorescent dopant or a green phosphorescent dopant.

The compound represented by Formula M-b may be represented by any one among the compounds blew. However, the compounds below are illustrative, and the compound represented by Formula M-b is not limited to those represented in the compounds below.

M-b-1

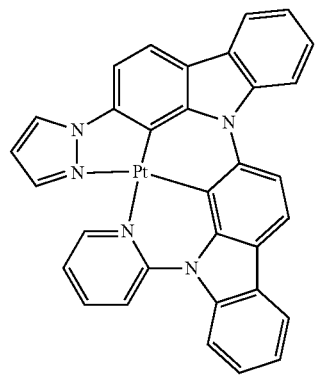

M-b-2

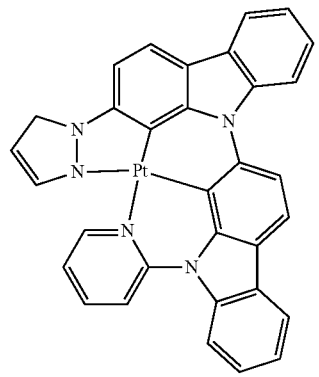

M-b-3

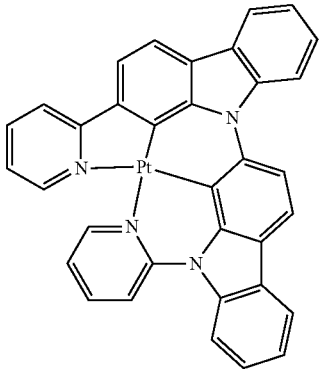

M-b-4

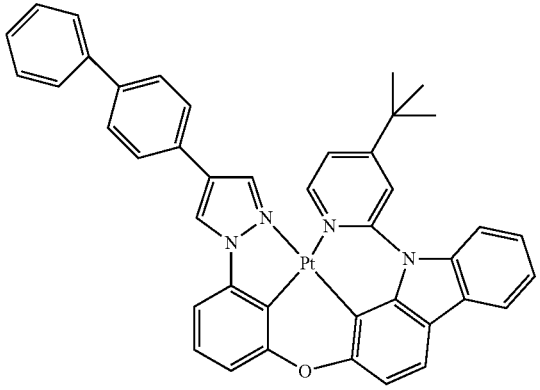

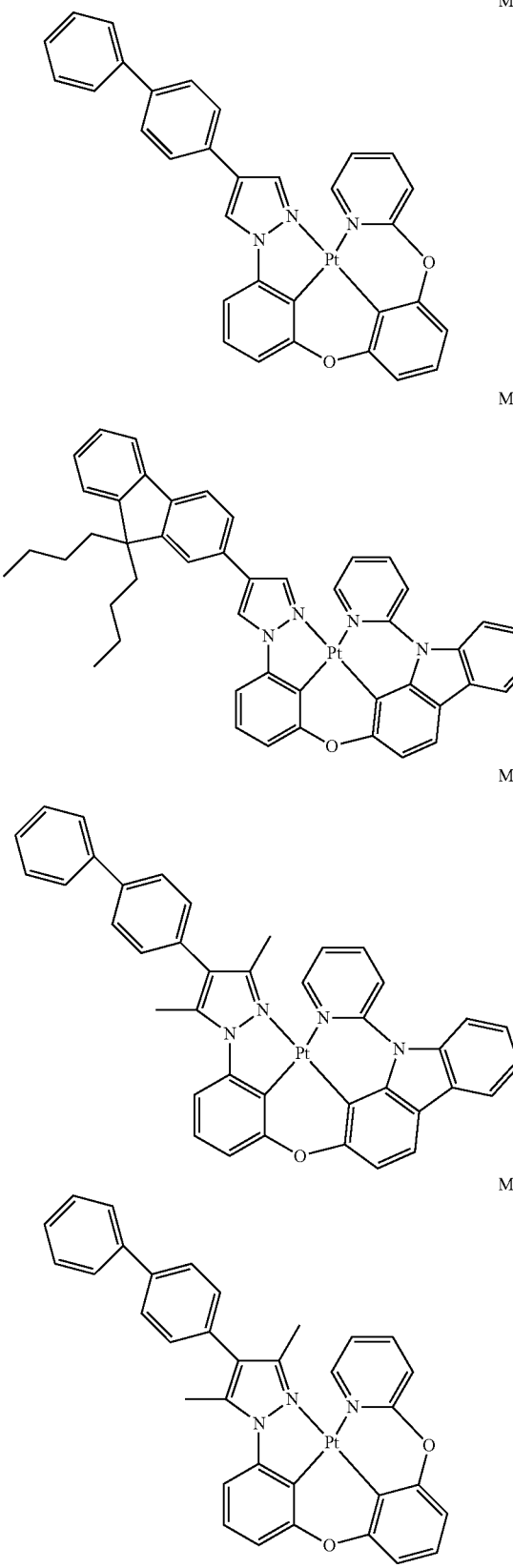
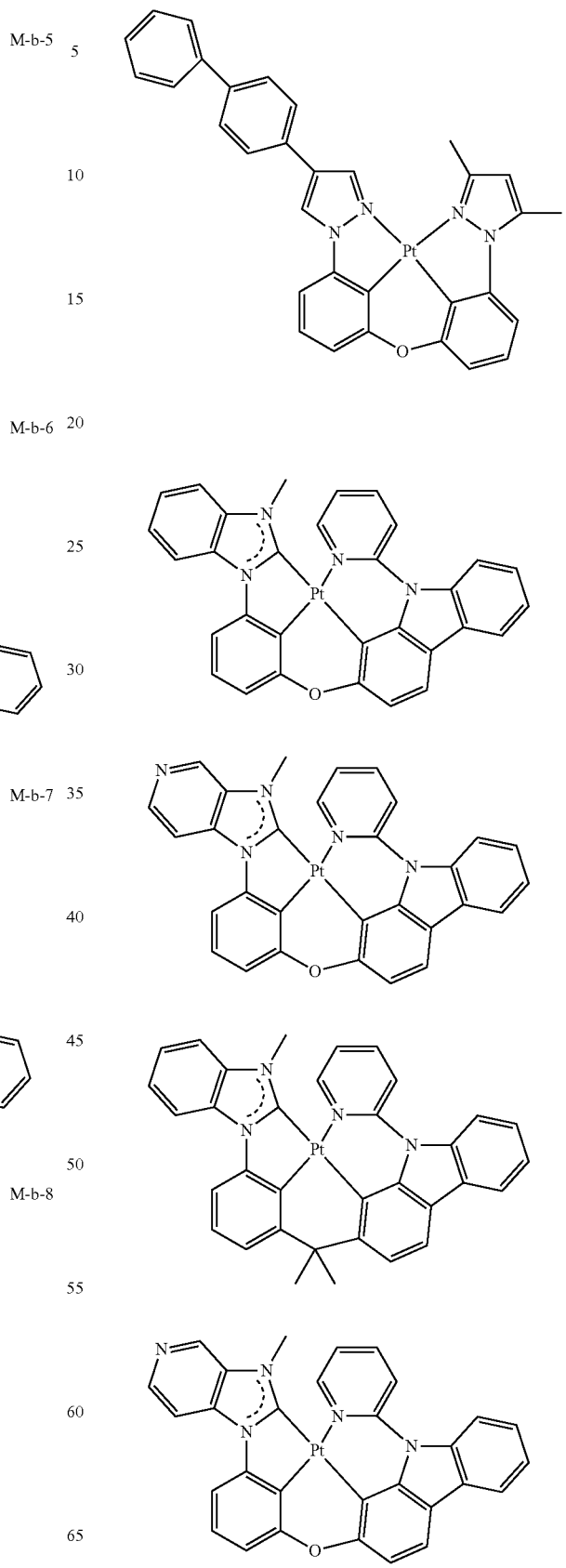

M-b-14

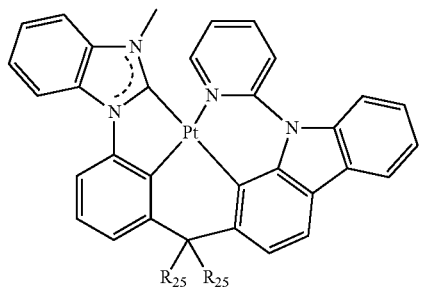

M-b-15

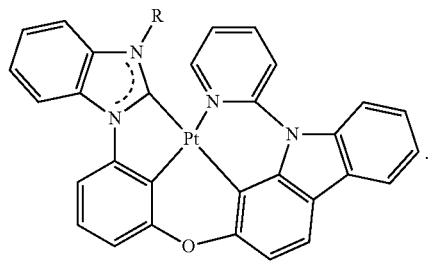

In the above compounds, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

The emission layer EML may include the compound represented by any one among Formula F-a to Formula F-c below. The compound represented by Formula F-a to Formula F-c below may be used as a fluorescent dopant material.

[Formula F-a]

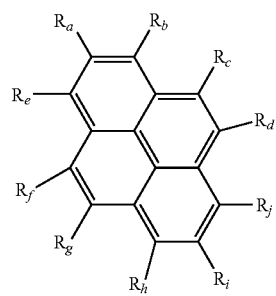

In Formula F-a above, two selected among $R_a$ to $R_j$ may be each independently substituted with *—$NAr_1Ar_2$. The remainder among $R_a$ to $R_j$ that are not substituted with *—$NAr_1Ar_2$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In *—$NAr_1Ar_2$, $Ar_1$ and $Ar_2$ may be each independently a substituted or unsubstituted ring-forming aryl group having 6 to 30 carbon atoms, or a substituted or unsubstituted ring-forming heteroaryl group having 2 to 30 carbon atoms.

For example, at least one of $Ar_1$ or $Ar_2$ may be a heteroaryl group including O or S as a ring-forming atom.

[Formula F-b]

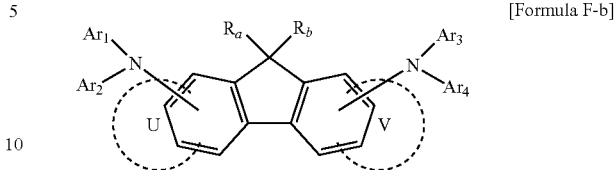

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring.

In Formula F-b, U and V may be each independently a substituted or unsubstituted ring-forming hydrocarbon ring having 5 to 30 carbon atoms, or a substituted or unsubstituted ring-forming heterocycle having 2 to 30 carbon atoms.

In Formula F-b, the number of rings represented by U and V may be each independently 0 or 1. For example, when the number of U or V is 1 in Formula F-b, one ring forms a condensed ring at the portion indicated by U or V, and when the number of U or V is 0, it means that the ring indicated as U or V does not exist. Specifically, when the number of U is 0 and the number of V is 1, or the number of U is 1 and the number of V is 0, the condensed ring having a fluorene core of Formula F-b may be a tetracyclic compound. In addition, when the numbers of U and V are both 0, the condensed ring of Formula F-b may be a tricyclic compound. Further, when the numbers of U and V are both 1, the condensed ring having a fluorene core of Formula F-b may be a pentacyclic compound.

[Formula F-c]

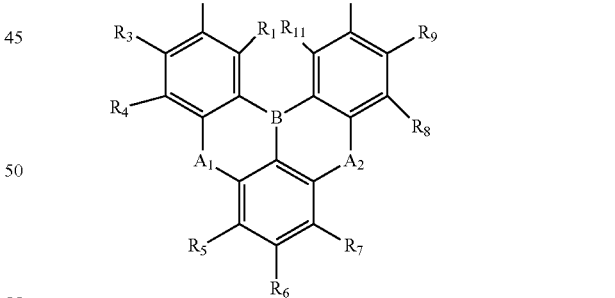

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring.

In Formula F-c, $A_1$ and $A_2$ may be each independently combined with substituents of an adjacent ring to form a condensed ring. For example, when $A_1$ and $A_2$ are each independently $NR_m$, $A_1$ may be combined with $R_4$ or $R_5$ to form a ring. In addition, $A_2$ may be combined with $R_7$ or $R_8$ to form a ring.

In an embodiment, the emission layer EML may include, as a known dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), 4,4'-bis[2-(4-(N,N-diphenylamino)phenyl)vinyl]biphenyl (DPAVBi), perylene and a derivative thereof (for example, 2,5,8,11-tetra-t-butylperylene (TBP)), pyrene and a derivative thereof (for example, 1,1-dipyrene,1,4-dipyrenylbenzene,1,4-bis(N,N-diphenylamino)pyrene), or the like.

The emission layer EML may include a known phosphorescent dopant material. For example, a metal complex including iridium (Ir), platinum (Pt), osmium (Os), gold (Au), titanium (Ti), zirconium (Zr), hafnium (Hf), europium (Eu), terbium (Tb), or thulium (Tm) may be used as a phosphorescent dopant. Specifically, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as a phosphorescent dopant. However, embodiments are not limited thereto.

Each of the first, second, and third floor stacks SF1, SF2, and SF3 may emit different color light from each other. For example, any one of the emission layers EML included in the first, second, and third floor stacks SF1, SF2, and SF3 may emit light of a color different from the other two. However, embodiments are not limited thereto, and all of the emission layers EML included in the first, second, and third floor stacks SF1, SF2, and SF3 may emit the same color light.

The electron transport region ETR may be disposed on the emission layer EML.

The electron transport region ETR may include at least one of the electron transport layer ETL or the hole blocking layer. However, embodiments are not limited thereto, and the hole transport region HTR may further include the hole injection layer, the buffer layer, or the light-emitting auxiliary layer.

The electron transport region ETR may have a single layer formed of a single material, a single layer formed of a plurality of different materials, or a multilayer structure having a plurality of layers formed of a plurality of different materials.

For example, the electron transport region ETR may have a structure of a single layer of the electron injection layer or the electron transport layer, and may have a structure of a single layer formed of the electron injection material and the electron transport material. In addition, the electron transport region ETR may have a single layer structure formed of a plurality of different materials, or a structure in which an electron transport layer/electron injection, or a hole blocking/electron transport layer/electron injection layer stacked in order from the emission layer EML, but embodiments are not limited thereto.

The electron transport region ETR may be formed by using various methods such as a vacuum deposition method, a spin coating method, a cast method, a Langmuir-Blodgett (LB) method, an inkjet printing method, a laser printing method, and a laser induced thermal imaging (LITI) method.

In an embodiment, the electron transport layer ETL may further include a conductive material to improve conductivity. The conductive material may be uniformly or non-uniformly dispersed in the electron transport layer ETL. The conductive material may be a conductor or a semiconductor. For example, the conductive material may have electric conductivity of about $10^{-4}$ $\Omega^{-1}m^{-1}$ to about $10^{7}$ $\Omega^{-1}m^{-1}$.

For example, the conductive material may be a p-type dopant. Specifically, the electron transport layer may include at least one among a halogenated metal compound such as CuI and RbI, a quinone derivative such as TCNQ and F4-TCNQ, a metal oxide such as tungsten oxide and molybdenum oxide, and a cyano group-containing compound such as HAT-CN and NDP-9.

In addition, the electron transport region ETR may include a known electron transport material. For example, the electron transport region ETR may include the compound represented by Formula ET-1 below.

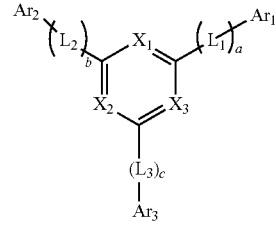

[Formula ET-1]

In Formula ET-1, at least one among $X_1$ to $X_3$ is N, and the remainder are CRa. $R_a$ may be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. $Ar_1$ to $Ar_3$ may be each independently a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula ET-1, "a" to "c" may be each independently an integer of 0 to 10. In Formula ET-1, $L_1$ to $L_3$ may be each independently a direct linkage, a substituted or unsubstituted ring-forming arylene group having 6 to 30 carbon atoms, or a substituted or unsubstituted ring-forming heteroarylene group having 2 to 30 carbon atoms. For example, when "a" to "c" are integer of 2 or more, $L_1$ to $L_3$ may be each independently a substituted or unsubstituted ring-forming arylene group having 6 to 30 carbon atoms, or a substituted or unsubstituted ring-forming heteroarylene group having 2 to 30 carbon atoms.

The electron transport region ETR may include an anthracene-based compound. However, embodiments are not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato)aluminum (BAlq), berylliumbis(benzoquinolin-10-olate) (Bebq2), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include at least one among Compounds ET1 to ET36 below.

ET1

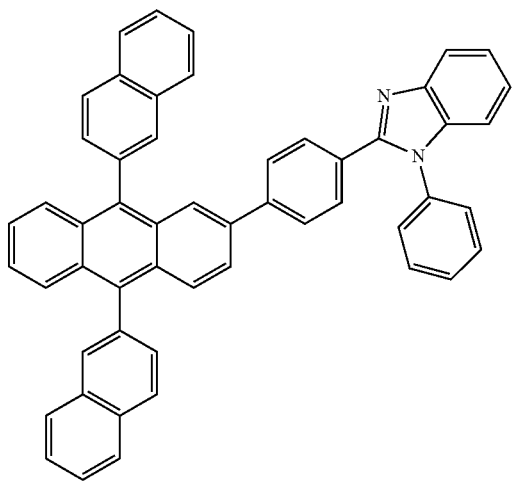

ET2

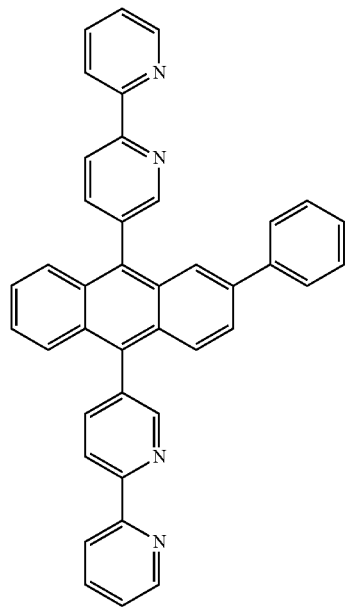

ET3

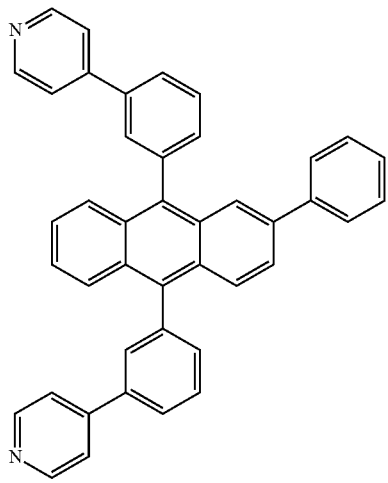

ET4

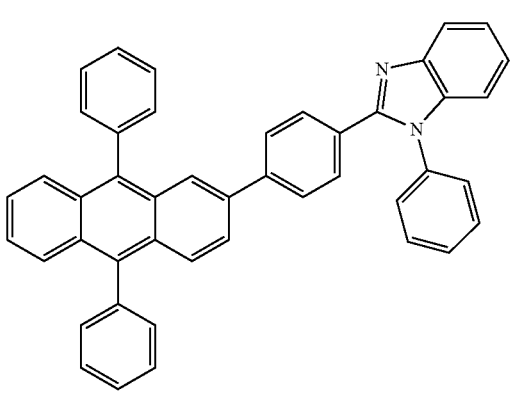

ET5

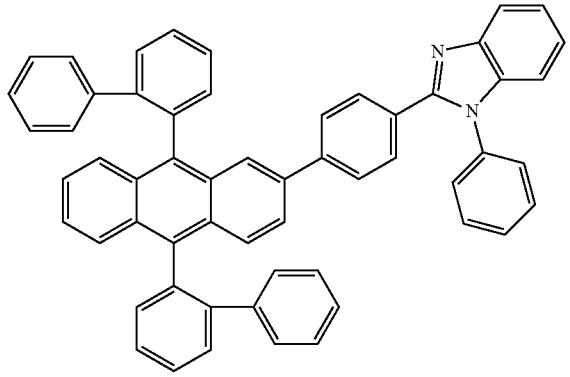

ET6
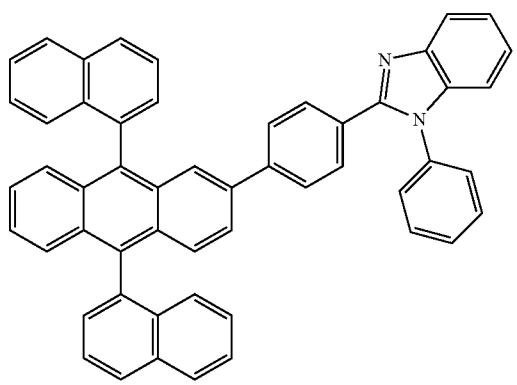
ET7
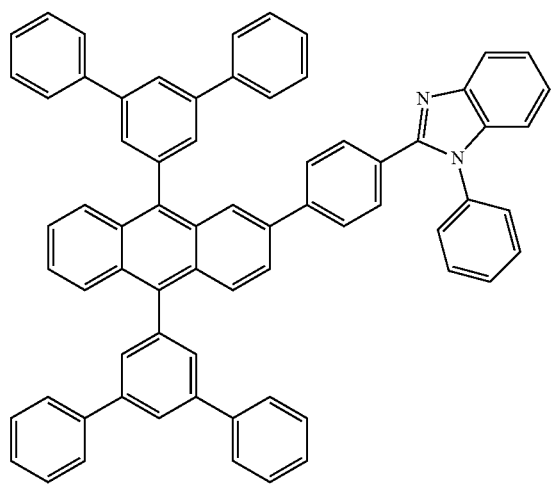
ET8
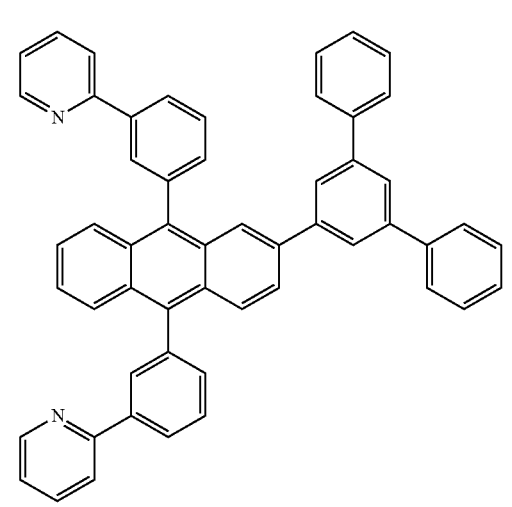
ET9
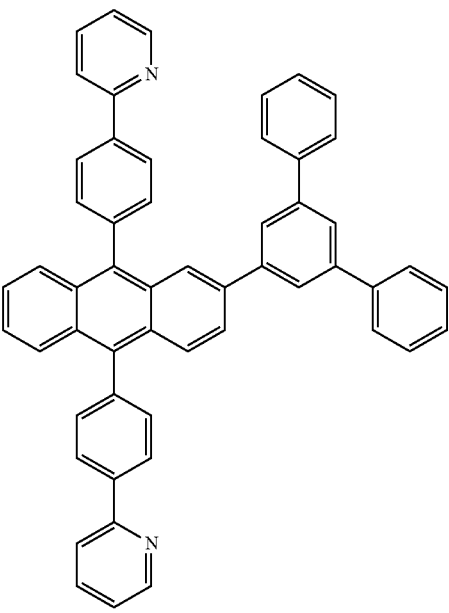
ET10
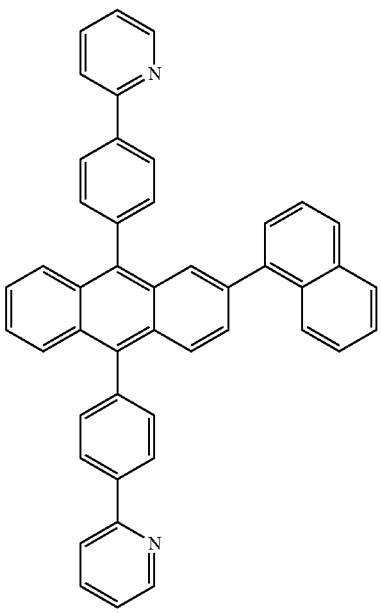

-continued
ET11
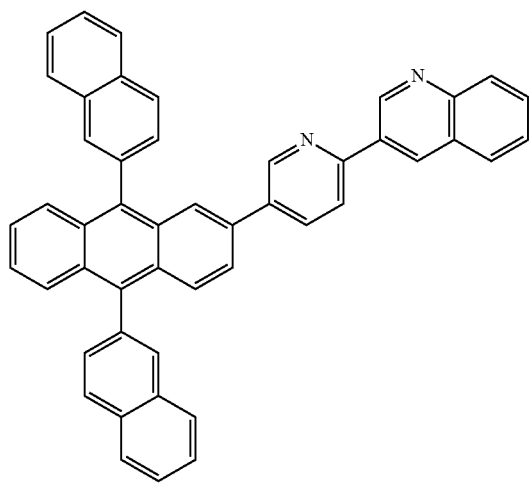
ET12
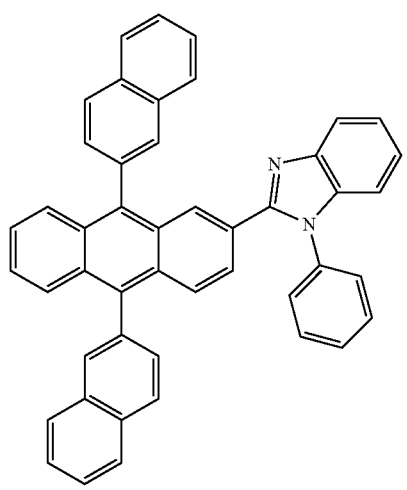
ET13
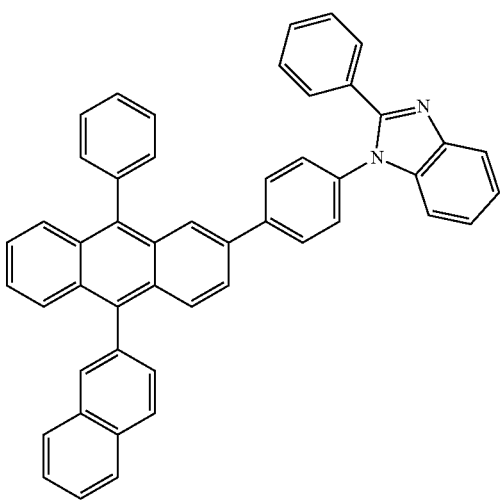
-continued
ET14
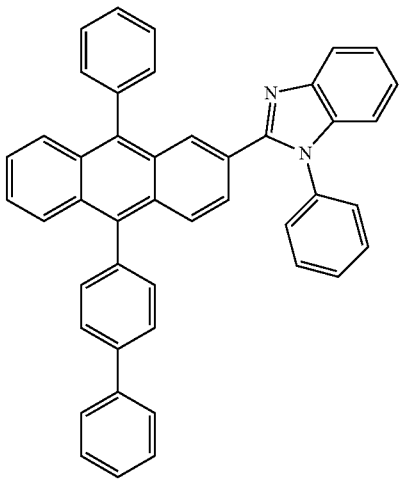
ET15
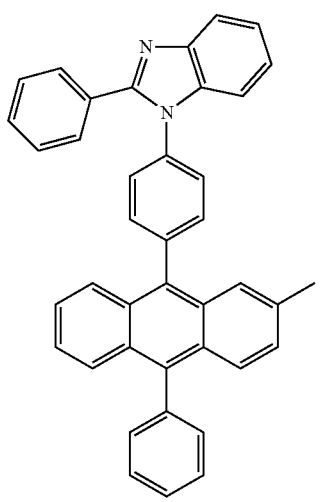
ET16
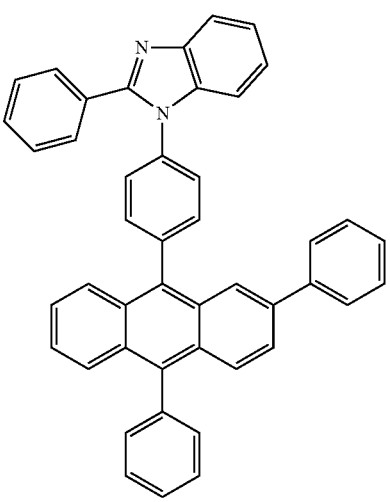

ET17
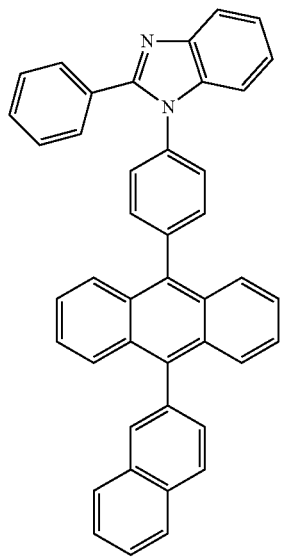
ET18
ET19
ET20
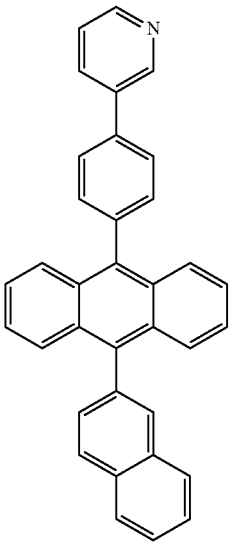
ET21
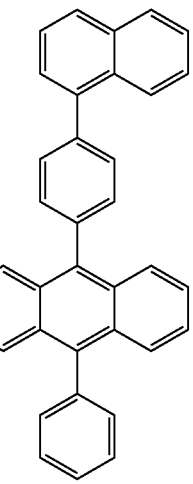
ET22
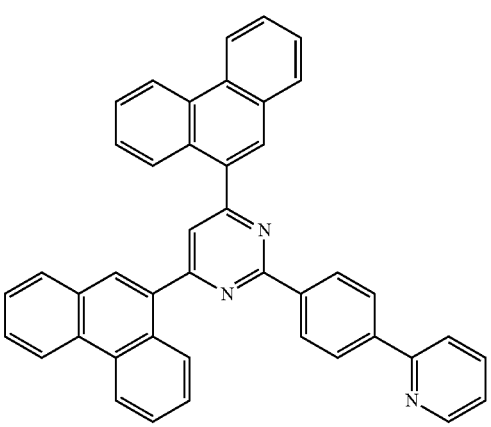

ET23
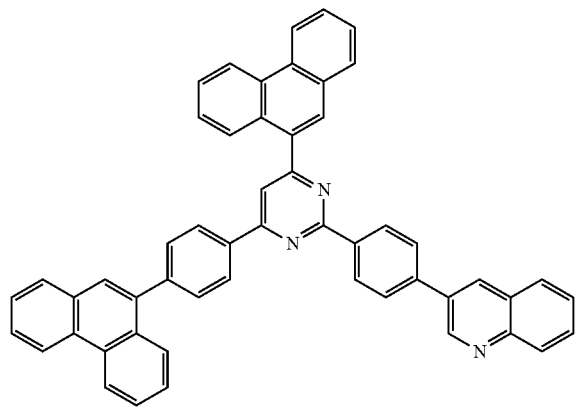
ET26
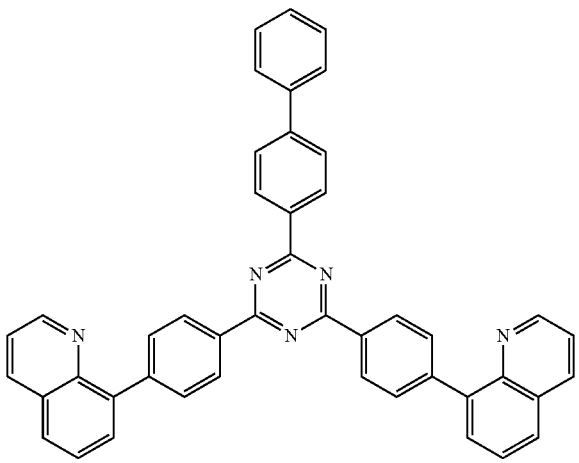
ET24
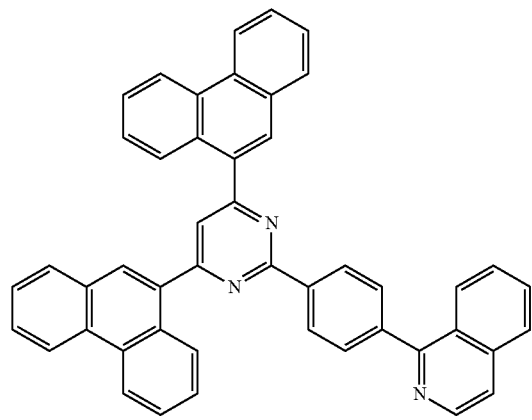
ET27
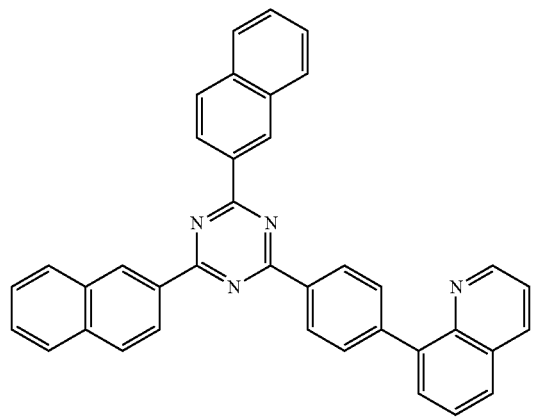
ET25
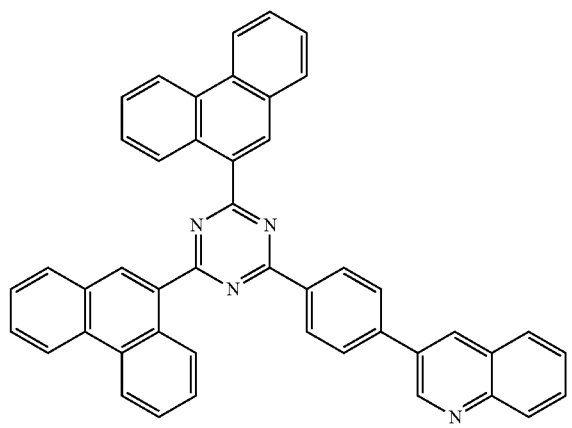
ET28
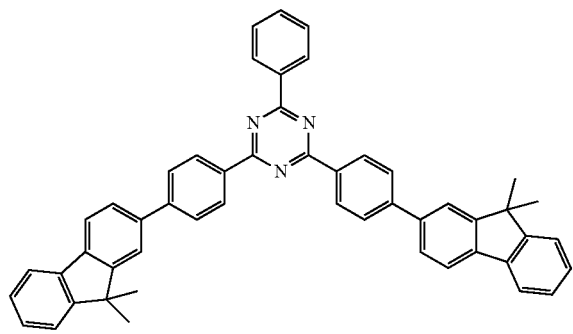

-continued
ET29
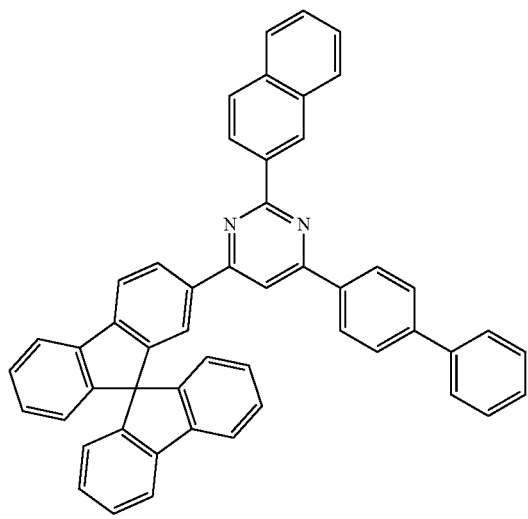
ET30
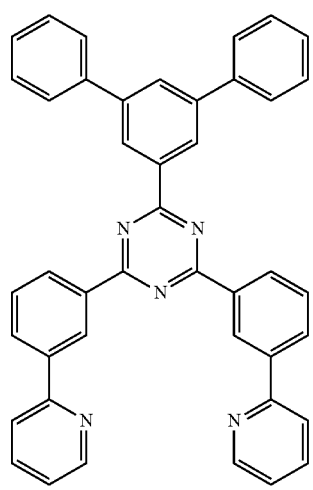
ET31
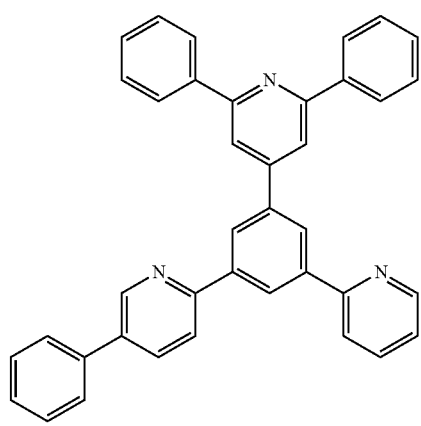
-continued
ET32
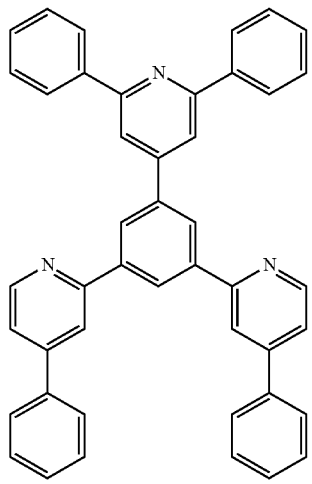
ET33
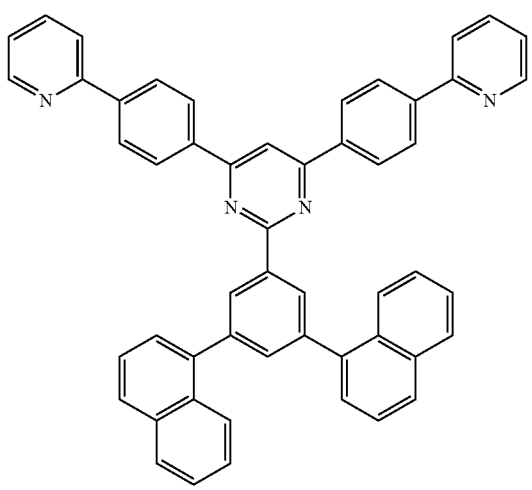
ET34
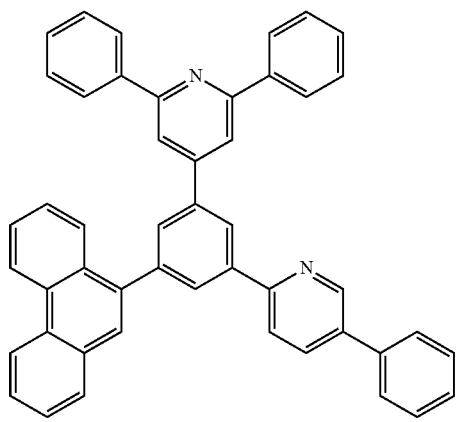

ET35

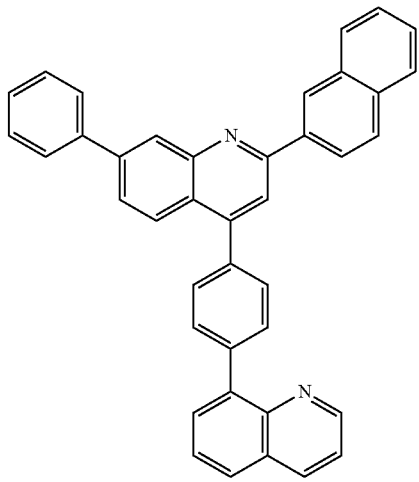

ET36

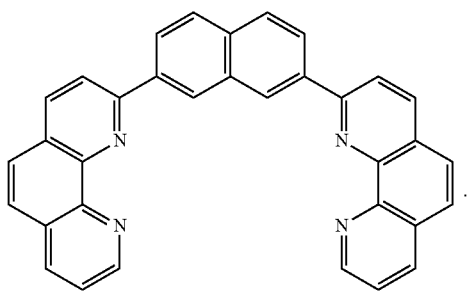

In addition, the electron transport region ETR may include a halogenated metal such as LiF, NaCl, CsF, RbCl, RbI, CuI, and KI, a lanthanide metal such as Yb, and a co-deposited material of the above-described halogenated metal and lanthanide metal as well. For example, the electron transport region ETR may include KI:Yb, RbI:Yb, or the like as a co-deposited material. For example, a metal oxide such as $Li_2O$ and BaO, 8-hydroxyl-lithium quinolate (Liq), or the like may be used in the electron transport region ETR, but embodiments are not limited thereto. The electron transport region ETR may also be formed of a mixture material of an electron transport material and an insulating organo metal salt. The organo metal salt may be a material having an energy band gap of about 4 eV or more. Specifically, the organo metal salt may include, for example, metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP) or 4,7-diphenyl-1,10-phenanthroline (Bphen) in addition to the above-described materials, but embodiments are not limited thereto.

The electron transport region ETR may include the aforementioned compounds of the electron transport region in at least one of the electron injection layer EIL, the electron transport layer ETL, or the hole blocking layer HBL.

When the electron transport region ETR includes the electron transport layer ETL, a thickness of the electron transport layer ETL may be about 100 Å to about 1000 Å, for example, about 150 Å to about 500 Å. When the thickness of the electron transport layer ETL satisfies the above-described range, satisfactory electron transport properties may be obtained without substantial increase of a driving voltage. When the electron transport region ETR includes the electron injection layer EIL, a thickness of the electron injection layer EIL may be about 1 Å to about 100 Å, for example, about 3 Å to about 90 Å. When the thickness of the electron injection layer EIL satisfies the above-described range, satisfactory electron injection properties may be obtained without substantial increase of a driving voltage.

The light-emitting element ED according to an embodiment may include the electron injection layer EIL below the second electrode EL2. However, embodiments are not limited thereto, and the electron injection layer may be disposed in the electron transport region ETR respectively included in the first, second, and third floor stacks SF1, SF2, and SF3.

The electron injection layer EIL may include a lanthanide metal such as Yb. However, embodiments are not limited thereto, and a halogenated metal such as LiF, NaCl, CsF, RbCl and RbI, a metal oxide such as $Li_2O$ and BaO, lithium quinolate (Liq), or the like may be used in the electron injection layer EIL. Alternatively, the electron injection layer EIL may be formed of a mixture material of the electron transport material and the insulating organo metal salt. The organo metal salt may be a material having an energy band gap of about 4 eV or more. Specifically, the organo metal salt may include, for example, metal acetates, metal benzoates, metal acetoacetates, metal acetylacetonates, or metal stearates.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be made of a transparent metal oxide such as indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or a mixture containing them (for example, Al—Li, Mg—In, AgMg, AgYb, or MgAg). Alternatively, the second electrode EL2 may have a multilayered structure including a reflective film or a transflective film formed of the above-described materials and a transparent conductive film formed of indium tin oxide (ITO), indium zinc oxide (IZO), zinc oxide (ZnO), indium tin zinc oxide (ITZO), or the like. For example, the second electrode EL2 may include the above-described metal material, a combination of two or more metal materials selected from the above-described metal materials, or an oxide of the above-described metal materials.

The first, second, and third light-emitting elements ED1, ED2, and ED3 may each independently include the above-described material in the hole transport region HTR, the emission layer EML, and the electron transport region ETR.

Figure 3A:
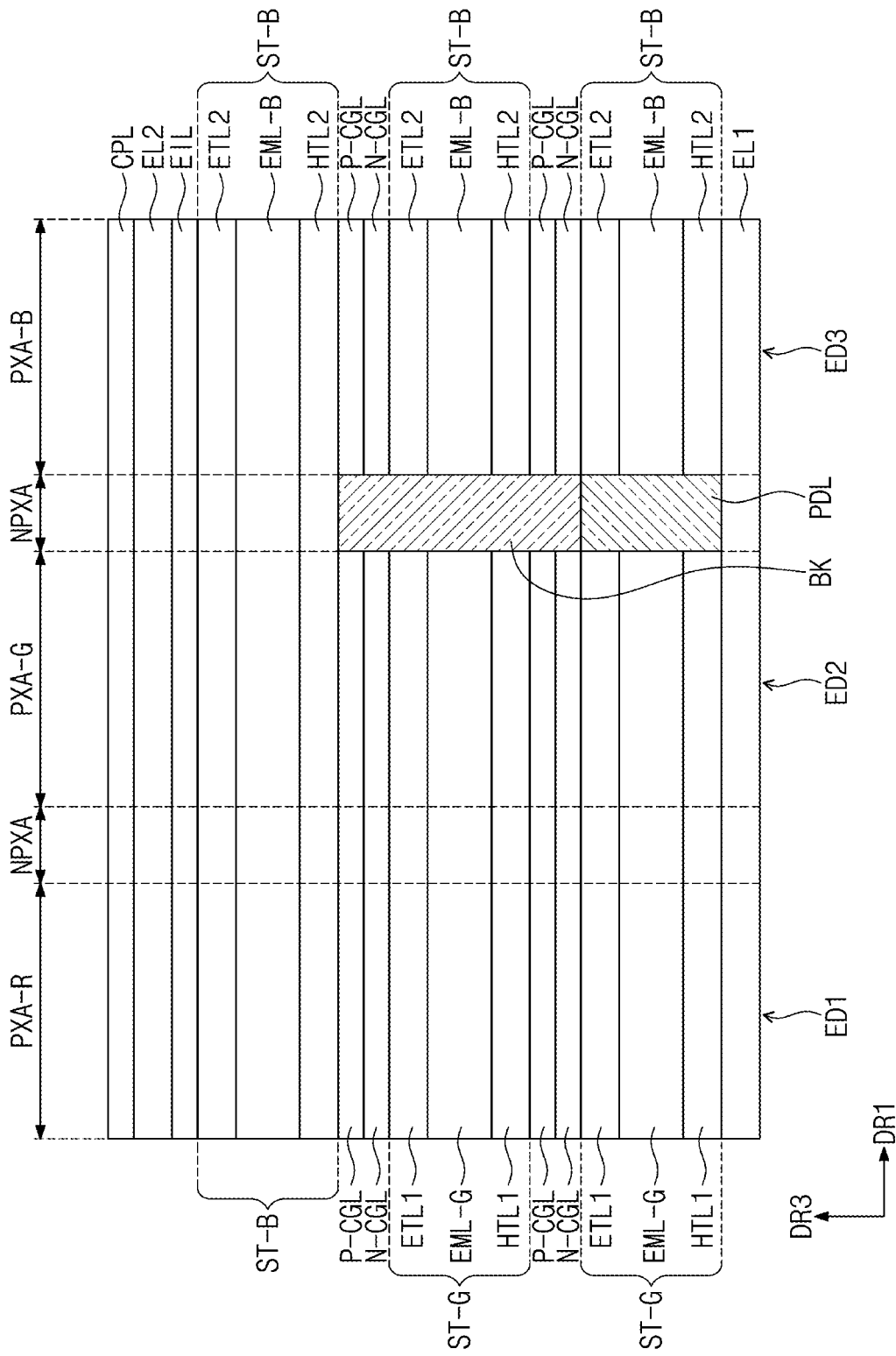
FIGS. 3A and 3B are cross-sectional views of the display device of FIG. 1 schematically illustrating other embodiments of the light-emitting elements thereof.
Figure 3B:
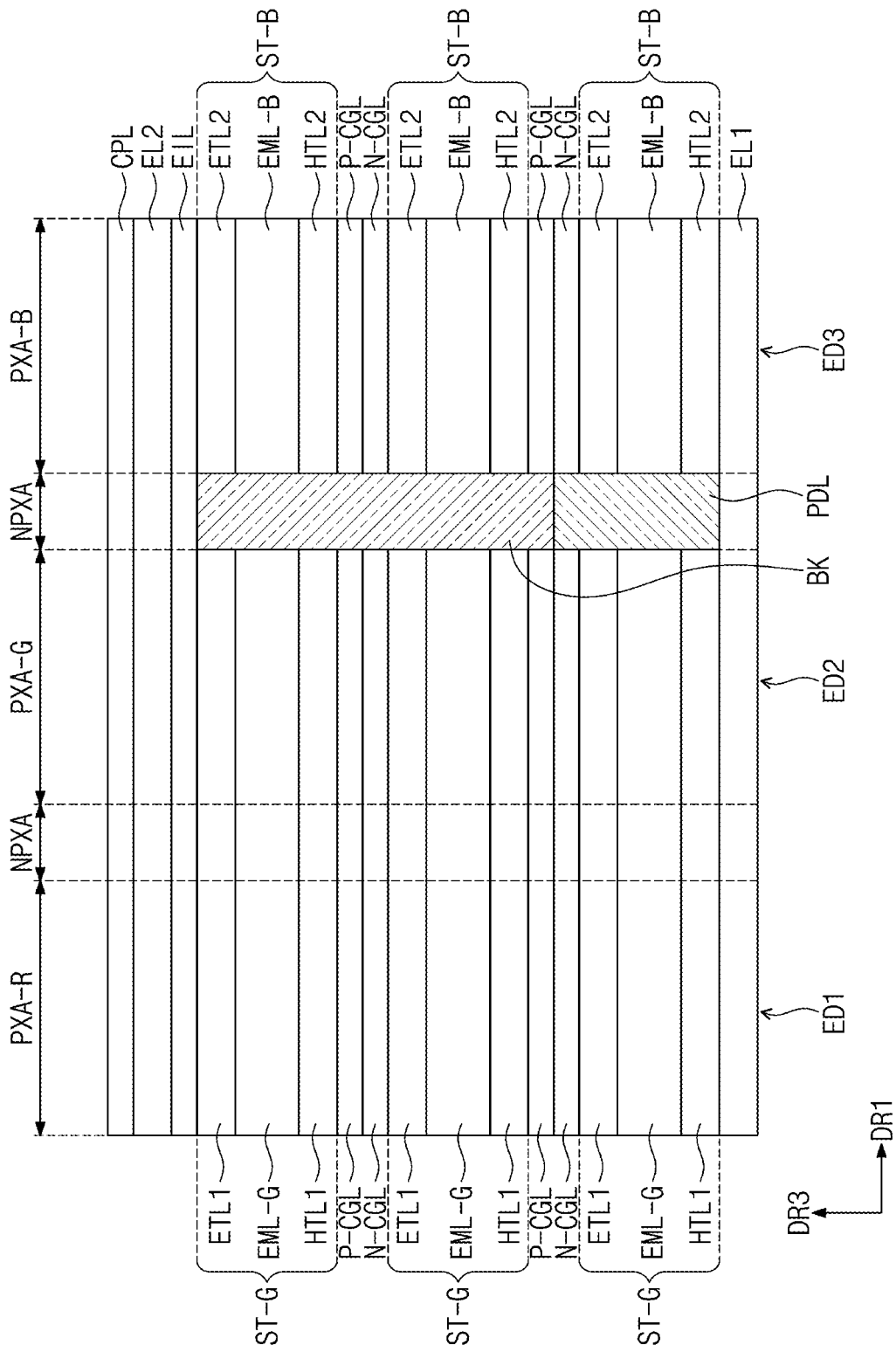

FIGS. 3A and 3B are cross-sectional views schematically illustrating light-emitting elements ED1, ED2, and ED3 according to an embodiment. FIGS. 3A and 3B each show the first, second, and third light-emitting elements ED1, ED2, and ED3 included in the display device DD of FIG. 2A. FIGS. 3A and 3B show that a capping layer CPL is further disposed on the first, second, and third light-emitting elements ED1, ED2, and ED3 of FIG. 2A. The capping layer CPL may include multiple layers or a single layer. In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, $SiN_x$, $SiO_y$, or the like.

For example, when the capping layer CPL includes an organic material, the organic material may include α-NPD, NPB, TPD, m-MTDATA, Alq3, CuPc, N4,N4,N4',N4'-tetra (biphenyl-4-yl) biphenyl-4,4'-diamine (TPD15), 4,4',4"-tris (carbazol sol-9-yl) triphenylamine (TCTA), etc., an epoxy resin, or acrylate such as methacrylate. However, embodiments are not limited thereto, and the capping layer CPL may include at least one among Compounds P1 to P5 below.

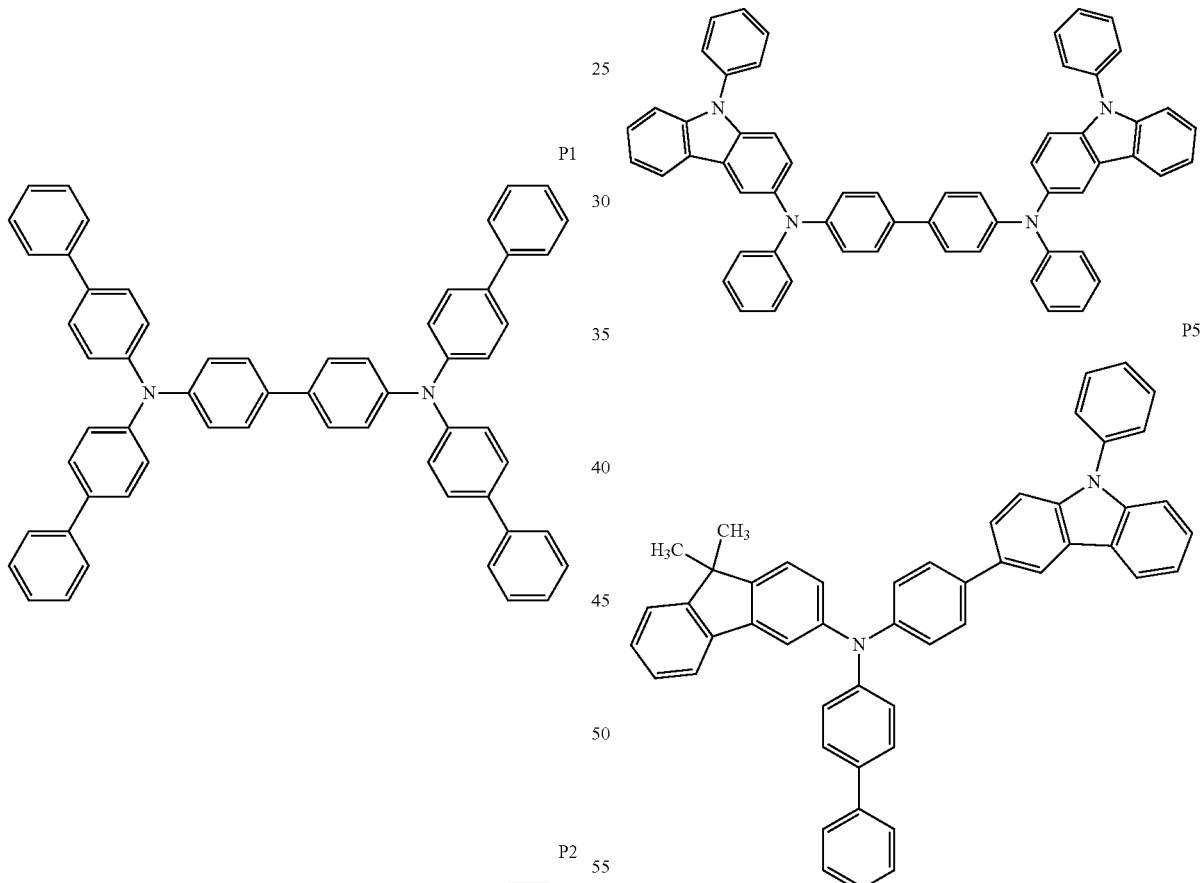

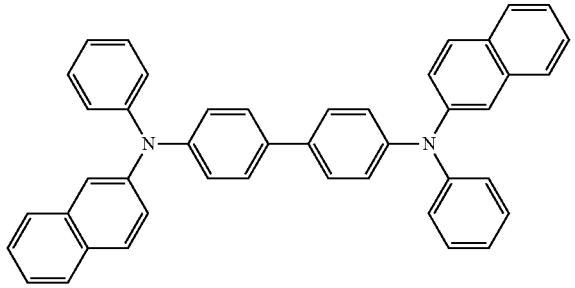

However, embodiments are not limited thereto, and the capping layer CPL may be omitted.

Referring to FIG. 3A, in an embodiment, each of the first, second, and third light-emitting elements ED1, ED2, and ED3 is shown to include three stacks. Specifically, each of the first, second, and third light-emitting elements ED1, ED2, and ED3 is shown to include three stacks corresponding to the first, second, and third floor stacks SF1, SF2, and SF3 described above in FIG. 2B. However, embodiments are not limited thereto, and each of the first, second, and third light-emitting elements ED1, ED2, and ED3 may include two stacks, or may include four or more stacks.

In an embodiment, the first light-emitting element ED1 may include a first stack ST-G as the first floor stack SF1 described above in FIGS. 2A and 2B, a first stack ST-G as the second floor stack SF2 described above in FIGS. 2A and 2B, and a second stack ST-B as the third floor stack SF3 described above in FIGS. 2A and 2B. For example, the first light-emitting element ED1 may include two first stacks ST-G and one second stack ST-B. However, the stacking order of the first stack ST-G and the second stack ST-B is not limited thereto. For example, the second stack ST-B may be the first floor stack SF1 or the second floor stack SF2. In addition, the configuration of the first light-emitting element ED1 is not limited thereto. For example, the first light-emitting element ED1 may include four stacks, for example, three second stacks ST-B and one first stack ST-G.

The charge generating layer may be disposed between the stacks ST-G and ST-B. Specifically, a p-type charge generating layer P-CGL and an n-type charge generating layer N-CGL may be stacked and disposed between the stacks ST-G and ST-B. The p-type charge generating layer P-CGL and the n-type charge generating layer N-CGL may promote the movement of holes and/or charges between the stacks ST-G and ST-B.

The first stack ST-G may emit second light, and the second stack ST-B may emit third light. For example, the first stack ST-G may emit green light, and the second stack ST-B may emit blue light.

Each of the first stack ST-G and the second stack ST-B may include the hole transport region, the emission layer, and the electron transport region described above. FIG. 3A simply illustrates that the hole transport region includes the electron transport layer, and the hole transport region includes the hole transport layer. For example, the first stack ST-G may include a first hole transport layer HTL1, a first emission layer EML-G, and a first electron transport layer ETL1. The first emission layer EML-G may emit second light.

For example, the second stack ST-B may include a second hole transport layer HTL2, a second emission layer EML-B, and a second electron transport layer ETL2. The second emission layer EML-B may emit third light.

However, embodiments are not limited thereto, and each of the first stack ST-G and the second stack ST-B may further include the electron injection layer, the hole blocking layer, the hole injection layer, the electron blocking layer, the buffer layer, or the like.

The first light-emitting element ED1 may include both the first stack ST-G and the second stack ST-B. thereby emitting second light and third light. The first light control portion CCP1 that overlaps the first light-emitting element ED1 may include the first quantum dot QD1, thereby converting second light and third light into first light.

The second light-emitting element ED2 according to an embodiment may have the same structure as the first light-emitting element ED1. For example, the second light-emitting element ED2 may include two first stacks ST-G and one second stack ST-B.

The second light-emitting element ED2 may include the first stack ST-G as the first floor stack SF1 described above in FIGS. 2A and 2B, the first stack ST-G as the second floor stack SF2 described above in FIGS. 2A and 2B, and the second stack ST-B as the third floor stack SF3 described above in FIGS. 2A and 2B. However, the stacking order of the first stack ST-G and the second stack ST-B is not limited thereto, and the configuration of the second light-emitting element ED2 is not limited thereto. The second light-emitting element ED2 has the same stacking structure as the first light-emitting element ED1, but the stacking order of the stacks ST-G and ST-B may vary.

In an embodiment, the second light-emitting element ED2 may include both the first stack ST-G and the second stack ST-B, thereby emitting second light and third light. The second light control portion CCP2 that overlaps the second light-emitting element ED2 may include the second quantum dot QD2, thereby transmitting second light, or converting third light into second light and transmit the second light.

The third light-emitting element ED3 according to an embodiment may have a different structure from the first light-emitting element ED1 and the second light-emitting element ED2. For example, the third light-emitting element ED3 may include three second stacks ST-B. Specifically, the first, second, and third floor stacks SF1, SF2, and SF3 of the third light-emitting element ED3 may all be the second stacks ST-B.

For example, as third floor stacks SF3 (see FIG. 2B) of the first, second, and third light-emitting elements ED1, ED2, and ED3 are all the second stack ST-B in the light-emitting elements ED1, ED2, and ED3 according to an embodiment shown in FIG. 3A, the third floor stacks SF3 (see FIG. 2B) of the first, second, and third light-emitting elements ED1, ED2, and ED3 may have an integral shape. The bank BK disposed on the pixel-defining film PDL may overlap the first floor stack SF1 (see FIG. 2B) and the second floor stack SF2 (FIG. 2B) of the third light-emitting element ED3 in the first direction DR1, and may not overlap the third floor stack SF3 (see FIG. 2B). However, embodiments are not limited thereto.

The first hole transport layer HTL1 and the second hole transport layer HTL2 may briefly illustrate a first hole transport region HTR1 and a second hole transport region HTR2, respectively. The first electron transport layer ETL1 and the second electron transport layer ETL2 may briefly illustrate a first electron transport region ETR1 and a second electron transport region ETR2, respectively.

In an embodiment, the first emission layer EML-G of the first stack ST-G may emit second light. For example, the first emission layer EML-G may emit green light, and specifically may emit green phosphorescence.

In an embodiment, the second emission layer EML-B of the second stack ST-B may emit third light. For example, the second emission layer EML-B may emit blue light, and specifically may emit blue fluorescence.

The display device DD according to an embodiment may emit green phosphorescence and blue fluorescence in the first emission layer EML-G and the second emission layer EML-B, respectively, and thus luminous efficiency of the display device DD may be improved.

Specifically, compared to a display device in which an emission layer only emits blue light, the display device according to an embodiment in which the emission layer emits both green light and blue light may have improved light conversion rate of green light in a light control layer CCL. Accordingly, compared to a display device in which an emission layer only emits blue light, the display device according to an embodiment may have increased amount of light having a central wavelength of about 500 nm to about 550 nm by about 60% or more.

In addition, the first emission layer EML-G emits phosphorescence, and the second emission layer EML-B emits fluorescence, and thus luminous efficiency of the display device according to an embodiment may be increased. Theoretically, internal quantum efficiency of fluorescence is about 25% to about 62.5%, and internal quantum efficiency of phosphorescence is up to 100%. As the display device according to an embodiment emits both phosphorescence and fluorescence in the emission layer, luminous efficiency may be further improved, compared to a display device in which an emission layer only emits fluorescence.

The first electron transport layer ETL1 may be disposed on the first emission layer EML-G. The second electron transport layer ETL2 may be disposed on the second emission layer EML-B. As the first emission layer EML-G and the second emission layer EML-B emit different light from each other, the electron mobility of the first electron transport layer ETL1 and the second electron transport layer ETL2 may be controlled differently.

For example, the electron mobility of the first electron transport layer ETL1 may be higher than that of the second electron transport layer ETL2. Specifically, a concentration of the conductive material included in the first electron transport layer ETL1 may be higher than a concentration of the conductive material included in the second electron transport layer ETL2.

For example, the conductive material may include a p-type dopant. Specifically, the conductive material may include at least one of NDP-9, HAT-CN, F4-TCNQ, or TCNQ.

For example, a concentration of NDP-9 included in the first electron transport layer ETL1 may be higher than a concentration of NDP-9 included in the second electron transport layer ETL2, and accordingly, the electron mobility of the first electron transport layer ETL1 may be higher than the electron mobility of the second electron transport layer ETL2.

In addition, a concentration of an insulating material included in the first electron transport layer ETL1 may be lower than a concentration of an insulating material included in the second electron transport layer ETL2. The insulating material may have an electric conductivity of about $10^{-4}$ $\Omega^{-1}m^{-1}$ or less.

For example, the insulating material may include a halogenated metal, or may include an oxide having a dielectric constant of about 5 or more.

Specifically, the insulating material may include at least one of alkali halide or lanthanum halide. For example, the insulating material may include any one of Li, Na, K, Rb, Cs, or Fr which are alkali metals and any one of F, Cl, Br, I, At, or Ts which are halogen elements. Alternatively, the insulating material may include any one of La, Ce, Pr, Nd, Pm, Sm, Eu, Gd, Tb, Dy, Ho, Er, Tm, Yb, or Lu which are lanthanide metals and any one of F, Cl, Br, I, At, or Ts which are halogen elements.

Specifically, the insulating material may include at least one of hafnium oxide ($HfO_X$), zirconium oxide ($ZrO_X$), lanthanum oxide ($LaO_X$), tantalum oxide ($TaO_X$), aluminum oxide ($Al_XO_Y$), silicon oxide ($SiO_X$), strontium oxide (SrO), yttrium oxide ($Y_2O_3$), calcium oxide (CaO), barium oxide (BaO), magnesium oxide (MgO), titanium oxide ($TiO_2$), zirconium-silicon oxide ($ZrSiO_4$), hafnium-silicon oxide ($HfSiO_4$), barium-zirconium oxide (BaZrO), or lanthanum-aluminum oxide ($LaAlO_X$) as an oxide having a dielectric constant of 5 or more.

In FIG. 3A, it is illustrated that an electron injection layer EIL overlaps first, second, and third pixel regions PXA-R, PXA-G, and PXA-B, and has an integral shape. However, embodiments are not limited thereto, and according to the overlapping pixel regions, the electron injection layer EIL may include a different material for each pixel region, or a concentration of the included material may be controlled differently. Specifically, the electron injection layer EIL may further include LiF and lithium quinolate (Liq) in addition to a lanthanide metal such as Yb. For example, a concentration of LiF and Liq in the electron injection layer that overlaps the first pixel region PXA-R, and the second pixel region PXA-G may be controlled to be smaller than a concentration of LiF and Liq in the electron injection layer that overlaps the third pixel region PXA-B. Accordingly, the lifespan of the display device DD may be improved by controlling the balance of the first, second, and third light-emitting elements ED1, ED2, and ED3.

Referring to FIG. 3B, each of the first light-emitting element ED1 and the second light-emitting element ED2 according to an embodiment may include three first stacks ST-G. Specifically, the first, second, and third floor stacks SF1, SF2, and SF3 of each of the first light-emitting element ED1 and the second light-emitting element ED2 may be all first stacks ST-G (see FIG. 2B). Accordingly, each of the first light-emitting element ED1 and the second light-emitting element ED2 may emit second light. For example, each of the first light-emitting element ED1 and the second light-emitting element ED2 may emit green phosphorescence.

The third light-emitting element ED3 according to an embodiment may have a different structure from the first light-emitting element ED1 and the second light-emitting element ED2. For example, the third light-emitting element ED3 may include three second stacks ST-B. Specifically, the first, second, and third floor stacks SF1, SF2, and SF3 (see FIG. 2B) of the third light-emitting element ED3 may be all second stacks ST-B. Accordingly, the third light-emitting element ED3 may emit third light. For example, the third light-emitting element ED3 may emit blue fluorescence.

The third light-emitting element ED3 may not have the same shape as the first light-emitting element ED1 and the second light-emitting element ED2. For example, the third light-emitting element ED3 may be spaced apart from the first light-emitting element ED1 and the second light-emitting element ED2 by the pixel-defining film PDL and the bank BK. In the figures, the pixel-defining film PDL and the bank BK are illustrated to have a separate shape, but embodiments are not limited thereto, and the pixel-defining film PDL and the bank BK may have an integral shape. For example, the pixel-defining film PDL and the bank BK may include the same material as each other.

Figure 4:
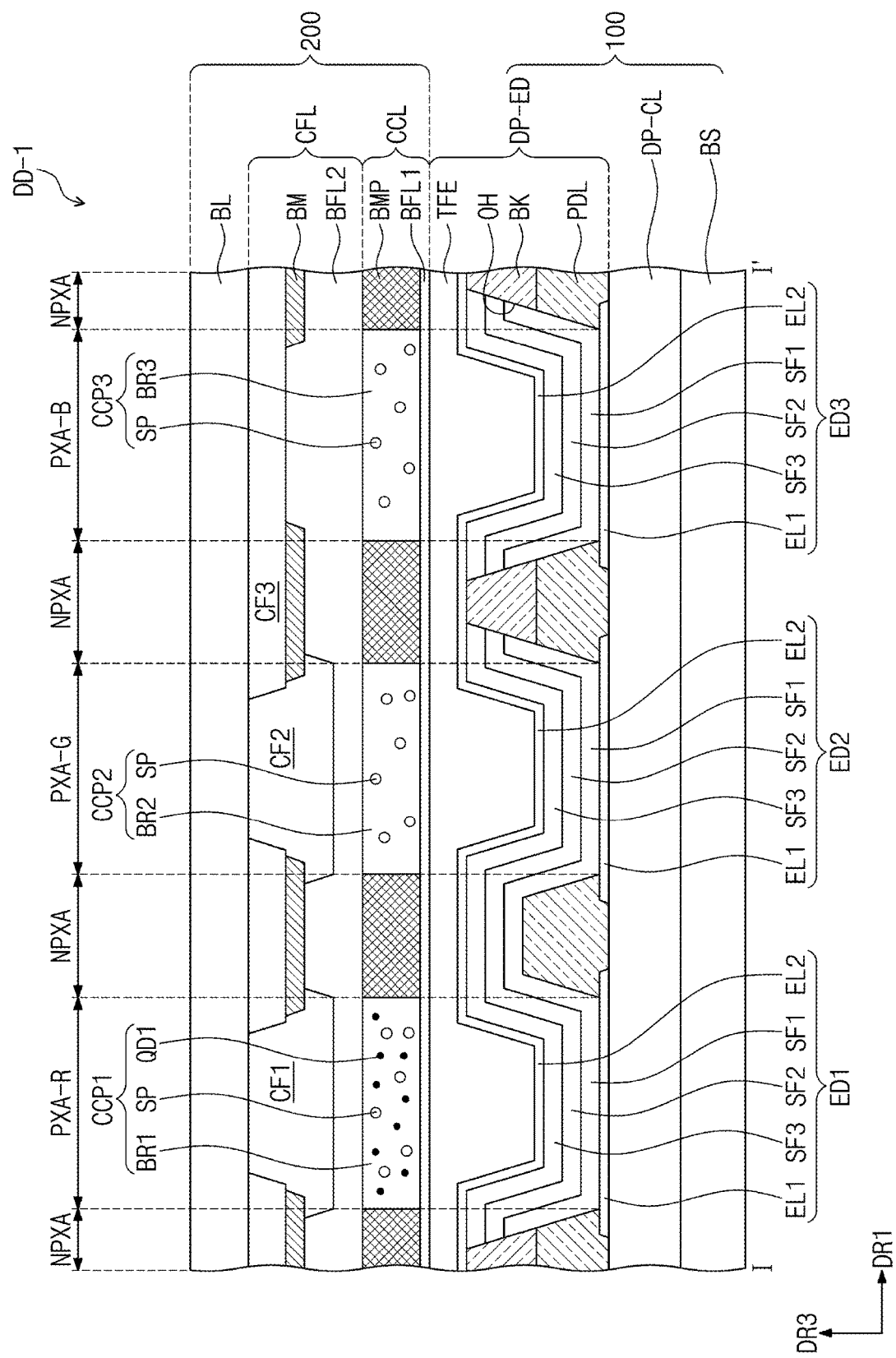
FIG. 4 shows a cross-sectional view taken along line I-I' in FIG. 1 illustrating another embodiment of the light-emitting elements of the display device of FIG. 1.

FIG. 4 shows a cross-sectional view of a display device DD-1 according to an embodiment.

Referring to FIG. 4, the first, second, and third light control portions CCP1, CCP2, and CCP3 may be configured in various ways according to light emitted by the first, second, and third light-emitting elements ED1, ED2, and ED3.

For example, in the display device DD-1 according to an embodiment, the first light-emitting element ED1 and the second light-emitting element ED2 may emit second light, and the third light-emitting element ED3 may emit third light. Specifically, the first light-emitting element ED1 and the second light-emitting element ED2 may emit green phosphorescence, and the third light-emitting element ED3 may emit blue fluorescence.

The first light control portion CCP1 according to an embodiment may include the first quantum dot QD1, the first base resin BR1, and the scatterer SP. The first light control portion CCP1 may convert second light emitted by the first light-emitting element ED1 into first light by the first quantum dot QD1.

The second light control portion CCP2 according to an embodiment may include the second base resin BR2 and the scatterer SP. For example, the second light control portion CCP2 may not include the second quantum dot QD2. The second light control portion CCP2 may transmit second light emitted by the second light-emitting element ED2.

The third light control portion CCP3 according to an embodiment may include the third base resin BR3 and the scatterer SP. The third light control portion CCP3 may transmit third light emitted by the third light-emitting element ED3.

Hereinafter, the evaluation result of the properties of the light-emitting element according to an embodiment will be described with reference to specific examples. However, embodiments are not limited to the examples below.

Examples for explaining manufacture and evaluation of light-emitting element will be described below.

A dopant and a doping concentration of the first electron transport layer and the second electron transport layer respectively included in the light-emitting elements of Examples 1 to 9 and Comparative Example 1 are listed in Table 1.

The first electron transport layer is an electron transport layer that overlaps the red pixel region and the green pixel region, and the second electron transport layer is an electron transport region that overlaps the blue pixel region.

In Examples 1 to 9 and Comparative Example 1, Compound ET1 below is doped with Liq or NDP-9 to manufacture the first electron transport layer. In Examples 1 to 9 and Comparative Example 1, Compound ET1 below is doped with Liq, SmF$_3$, or YbF$_3$ to manufacture the second electron transport layer.

As described above, NDP-9 has higher conductivity than SmF$_3$ and YbF$_3$, and SmF$_3$ and YbF$_3$ have higher insulating properties than NDP-9. In addition, Liq is used as a material having strong insulating properties.

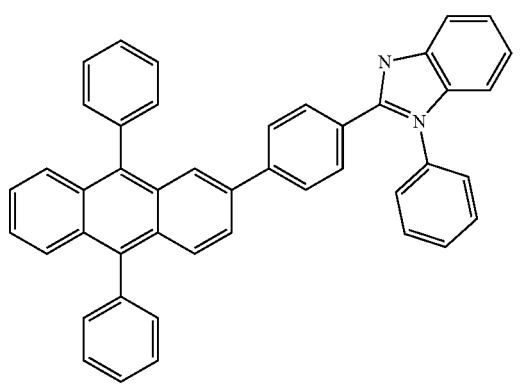

ET1

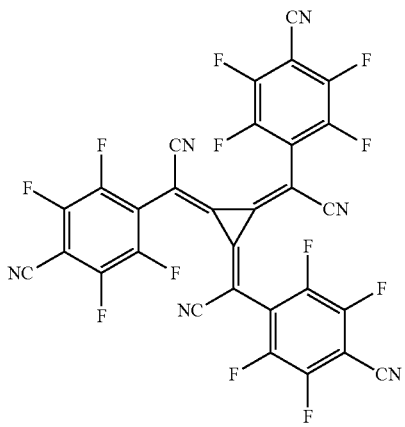

NDP-9

TABLE 1

| Number | First electron transport layer | | Second electron transport layer | |
|---|---|---|---|---|
| | Dopant | Doping concentration(%) | Dopant | Doping concentration(%) |
| Example 1 | Liq | 30 | Liq | 65 |
| Example 2 | NDP-9 | 1 | SmF$_3$ | 6 |
| Example 3 | NDP-9 | 5 | SmF$_3$ | 6 |
| Example 4 | NDP-9 | 10 | SmF$_3$ | 6 |
| Example 5 | NDP-9 | 5 | SmF$_3$ | 2 |
| Example 6 | NDP-9 | 5 | SmF$_3$ | 4 |
| Example 7 | NDP-9 | 5 | SmF$_3$ | 8 |
| Example 8 | NDP-9 | 5 | SmF$_3$ | 10 |
| Example 9 | NDP-9 | 5 | YbF$_3$ | 5 |
| Comparative Example 1 | Liq | 50 | Liq | 50 |

Referring to Table 1, in the light-emitting element according to Example 1, a doping concentration of Liq in the first electron transport layer is lower than a doping concentration of Liq in the second electron transport layer. In the light-emitting element according to Examples 2 to 9, Compound ET1 is doped with NDP-9, a conductive material, to manufacture the first electron transport layer, and Compound ET1 is doped with SmF$_3$ or YbF$_3$, an insulating material, to manufacture the second electron transport layer.

In Comparative Example 1, the doping concentration of Liq in the first electron transport layer is the same as the doping concentration of Liq in the second electron transport layer.

For example, the light-emitting elements according to Examples 1 to 9 are manufactured so that the electron mobility of the first electron transport layer is higher than the electron mobility of the second electron transport layer. The light-emitting element according to Comparative Example 1 is manufactured so that the electron mobility of the first electron transport layer and the electron mobility of the second electron transport layer are the same as each other.

The driving voltage, efficiency, and lifespan of the light-emitting elements manufactured in Table 1 are shown in Table 2. The driving voltage shown in Table 2 represents the voltage value measured at a current of about 10 mA. The lifespan is the measurement of time taken until the luminance of the light-emitting element drops to about 97% of the initial.

The efficiency and lifespan of the elements are represented as relative values based on Comparative Example 1.

For example, the efficiency and lifespan correspond to the relative ratio when the efficiency and lifespan in Comparative Example 1 are 100%.

TABLE 2

| Number | Driving voltage | Efficiency | Lifespan (T97) |
|---|---|---|---|
| Example 1 | 4.5 V | 102% | 180% |
| Example 2 | 4.1 V | 105% | 140% |
| Example 3 | 3.8 V | 115% | 160% |
| Example 4 | 3.7 V | 108% | 125% |
| Example 5 | 3.7 V | 110% | 135% |
| Example 6 | 3.7 V | 112% | 155% |
| Example 7 | 3.8 V | 121% | 147% |
| Example 8 | 3.9 V | 109% | 152% |
| Example 9 | 4.1 V | 105% | 110% |
| Comparative Example 1 | 4.2 V | 100% | 100% |

Referring to Table. 2, the average driving voltage of the light-emitting elements according to Examples 1 to 9 is lower than the driving voltage of the light-emitting element according to Comparative Example 1. In addition, the light-emitting elements according to Examples 1 to 9 showed the improved efficiency and lifespan compared to the light-emitting element according to Comparative Example 1. Based on the result, it is confirmed that the light-emitting element according to an embodiment is controlled so that the electron mobility of the first electron transport layer is higher than the electron mobility of the second electron transport layer, resulting in lowering the driving voltage when the element is driven, and thus the efficiency and lifespan may be improved.

For example, as the first electron transport layer that overlaps the red and green pixel regions has the higher electron mobility than the second electron transport layer that overlaps the blue pixel region, the efficiency and lifespan of the element may be improved.

The display device according to an embodiment may increase the electron mobility of the first electron transport layer ETL1 and lower the electron mobility of the second electron transport layer ETL2, thereby balancing the electron mobility of the first stack ST-G and the second stack ST-B. Accordingly, the lifespan of the display device DD including the first stack ST-G and the second stack ST-B that emit different color lights from each other may be improved.

The display device according to an embodiment may improve luminous efficiency and lifespan.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
an upper display substrate comprising a first pixel region configured to emit a first light having a first wavelength region, a second pixel region configured to emit a second light having a second wavelength region different from the first wavelength region of the first light, and a third pixel region configured to emit a third light having a third wavelength region different from the first wavelength region of the first light and the second wavelength region of the second light; and
a lower display substrate comprising a first light-emitting element disposed to overlap the first pixel region, a second light-emitting element disposed to overlap the second pixel region, and a third light-emitting element disposed to overlap the third pixel region, and
wherein the second light-emitting element comprises one or more first stacks configured to emit the second light, the one or more first stacks comprising a plurality of organic layers,
the third light-emitting element comprises one or more second stacks configured to emit the third light, the one or more second stacks comprising a plurality of organic layers,
the one or more first stacks comprise a first hole transport region, a first emission layer, and a first electron transport region,
the one or more second stacks comprise a second hole transport region, a second emission layer, and a second electron transport region, and
a concentration of a conductive material included in the first electron transport region is higher than a concentration of a conductive material included in the second electron transport region.

2. The display device of claim 1, wherein:
the first electron transport region comprises a first electron transport layer,
the second electron transport region comprises a second electron transport layer, and
a concentration of a conductive material included in the first electron transport layer is higher than a concentration of a conductive material included in the second electron transport layer.

3. The display device of claim 1, wherein the conductive material is a p-type dopant.

4. The display device of claim 1, wherein the conductive material comprises at least one of 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP-9), dipyrazino[2,3-f: 2',3'-h] quinoxaline-2,3,6,7,10,11-hexacarbonitrile (HAT-CN), 2,3,5,6-tetrafluoro-7,7,8,8-tetracyanoquinodimethane (F4-TCNQ), or tetracyanoquinodimethane (TCNQ).

5. The display device of claim 1, wherein:
the first electron transport region comprises a first electron transport layer,
the second electron transport region comprises a second electron transport layer, and
a concentration of an insulating material included in the first electron transport layer is lower than a concentration of an insulating material included in the second electron transport layer.

6. The display device of claim 5, wherein the insulating material comprises at least one halogenated metal or comprises an oxide having a dielectric constant of about 5 or more.

7. The display device of claim 1, wherein the lower display substrate further comprises a bank disposed between the second light-emitting element and the third light-emitting element, and
the bank is not disposed between the first light-emitting element and the second light-emitting element.

8. The display device of claim 7, wherein the upper display substrate further comprises a non-pixel region adjacent to the first, second, and third pixel regions,
the lower display substrate further comprises a pixel-defining film disposed to overlap the non-pixel region, and
the bank is disposed to overlap the pixel-defining film.

9. The display device of claim 1, wherein the upper display substrate comprises:
a first light control portion that overlaps the first pixel region and comprises a first quantum dot;
a second light control portion that overlaps the second pixel region and transmits the second light; and
a third light control portion that overlaps the third pixel region and transmits the third light, and
the first quantum dot is configured to convert the second light or the third light into the first light.

10. The display device of claim 9, wherein:
the second light-emitting element comprises the one or more first stacks and the one or more second stacks,
the second light control portion comprises a second quantum dot, and
the second quantum dot is configured to convert the third light into the second light.

11. The display device of claim 9, wherein the second light-emitting element comprises only the one or more first stacks.

12. The display device of claim 1, wherein the first light-emitting element has a same structure as the second light-emitting element.

13. The display device of claim 1, wherein the third light-emitting element comprises only the one or more second stacks.

14. The display device of claim 1, wherein the first light is a red light, the second light is a green light, and the third light is a blue light.

15. The display device of claim 1, wherein:
the one or more first stacks are configured to emit green phosphorescence, and
the one or more second stacks are configured to emit blue fluorescence.

16. The display device of claim 1, wherein:
the second light-emitting element comprises a first electron transport layer,
the third light-emitting element comprises a second electron transport layer, and
a concentration of an electron transport material included in the second electron transport layer is equal to or greater than a concentration of an electron transport material included in the first electron transport layer.

17. A display device comprising:
a base layer in which a first pixel region, a second pixel region, and a third pixel region are defined; and
a first light-emitting element disposed on the base layer to overlap the first pixel region, a second light-emitting element disposed on the base layer to overlap the second pixel region, and a third light-emitting element disposed on the base layer to overlap the third pixel region, and
wherein the second light-emitting element comprises one or more first stacks configured to emit a first color light,
the third light-emitting element comprises one or more second stacks configured to emit a second color light,
the first stack comprises a first hole transport layer, a first emission layer configured to emit the first color light, and a first electron transport layer,
the second stack comprises a second hole transport layer, a second emission layer configured to emit the second color light, and a second electron transport layer, and
electron transport properties of the first electron transport layer are greater than electron transport properties of the second electron transport layer.

18. The display device of claim 17, wherein:
the first color light is a green light,
the second color light is a blue light, and
a concentration of a conductive material included in the first electron transport layer is higher than a concentration of a conductive material included in the second electron transport layer, and
the conductive material comprises at least one of 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP-9), dipyrazino[2,3-f: 2',3'-h]quinoxaline-2,3,6,7,10,11-hexacarbonitrile (HAT-CN), 2,3,5,6-tetrafluoro-7,7,8,8-tetracyanoquinodimethane (F4-TCNQ), or tetracyanoquinodimethane (TCNQ).

19. The display device of claim 17, wherein a concentration of an insulating material included in the first electron transport layer is lower than a concentration of an insulating material included in the second electron transport layer, and
the insulating material comprises at least one halogenated metal or comprises an oxide having a dielectric constant of about 5 or more.

20. The display device of claim 17, wherein the display device further comprises a bank disposed on the base layer, the bank disposed between the second light-emitting element and the third light-emitting element, and
the bank is not disposed between the first light-emitting element and the second light-emitting element.

* * * * *